(12) United States Patent
Kurokawa et al.

(10) Patent No.: US 9,985,069 B2
(45) Date of Patent: May 29, 2018

(54) SEMICONDUCTOR DEVICE

(71) Applicant: Semiconductor Energy Laboratory Co., Ltd., Atsugi-shi, Kanagawa-ken (JP)

(72) Inventors: Yoshiyuki Kurokawa, Sagamihara (JP); Takayuki Ikeda, Atsugi (JP); Hikaru Tamura, Zama (JP); Munehiro Kozuma, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days. days.

(21) Appl. No.: 14/740,720

(22) Filed: Jun. 16, 2015

(65) Prior Publication Data
US 2015/0279896 A1 Oct. 1, 2015

Related U.S. Application Data

(60) Continuation of application No. 14/294,556, filed on Jun. 3, 2014, now Pat. No. 9,066,035, which is a
(Continued)

(30) Foreign Application Priority Data

Mar. 12, 2010 (JP) ................... 2010-056526

(51) Int. Cl.
H01L 29/10 (2006.01)
H01L 27/146 (2006.01)
(Continued)

(52) U.S. Cl.
CPC ...... H01L 27/14643 (2013.01); G02F 1/1362 (2013.01); H01L 27/1225 (2013.01);
(Continued)

(58) Field of Classification Search
CPC ........ G02F 1/1362; G02F 2001/13312; H04N 5/378; H01L 27/1225; H01L 27/1464; H01L 27/14643; H01L 27/14632
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 001317830 A 10/2001
CN 001491028 A 4/2004
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

Primary Examiner — Hung Vu
(74) Attorney, Agent, or Firm — Robinson Intellectual Property Law Office; Eric J. Robinson

(57) ABSTRACT

An object is to achieve low-power consumption by reducing the off-state current of a transistor in a photosensor. A semiconductor device including a photosensor having a photodiode, a first transistor, and a second transistor; and a read control circuit including a read control transistor, in which the photodiode has a function of supplying charge based on incident light to a gate of the first transistor; the first transistor has a function of storing charge supplied to its gate and converting the charge stored into an output signal; the second transistor has a function of controlling reading of the output signal; the read control transistor functions as a resistor converting the output signal into a voltage signal;
(Continued)

and semiconductor layers of the first transistor, the second transistor, and the read control transistor are formed using an oxide semiconductor.

17 Claims, 10 Drawing Sheets

Related U.S. Application Data division of application No. 13/039,491, filed on Mar. 3, 2011, now Pat. No. 8,766,338.

(51) Int. Cl.
G02F 1/1362 (2006.01)
H04N 5/378 (2011.01)
H01L 27/12 (2006.01)
G02F 1/133 (2006.01)

(52) U.S. Cl.
CPC .... H01L 27/1464 (2013.01); H01L 27/14632 (2013.01); H04N 5/378 (2013.01); G02F 2001/13312 (2013.01)

(58) Field of Classification Search
USPC .............................................. 257/43, 57, 72
See application file for complete search history.

(56) References Cited

U.S. PATENT DOCUMENTS

| | | | |
|---|---|---|---|
| 6,051,857 A | 4/2000 | Miida | |
| 6,236,063 B1 * | 5/2001 | Yamazaki | G02F 1/13318 257/59 |
| 6,294,274 B1 | 9/2001 | Kawazoe et al. | |
| 6,512,547 B1 | 1/2003 | Miida | |
| 6,563,174 B2 | 5/2003 | Kawasaki et al. | |
| 6,727,522 B1 | 4/2004 | Kawasaki et al. | |
| 6,747,638 B2 | 6/2004 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,238,554 B2 | 7/2007 | Schuele et al. | |
| 7,242,449 B1 | 7/2007 | Yamazaki et al. | |
| 7,271,834 B2 | 9/2007 | Kasuga et al. | |
| 7,271,835 B2 | 9/2007 | Iizuka et al. | |
| 7,282,782 B2 | 10/2007 | Hoffman et al. | |
| 7,297,977 B2 | 11/2007 | Hoffman et al. | |
| 7,307,300 B2 | 12/2007 | Inoue | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,525,523 B2 | 4/2009 | Yamazaki et al. | |
| 7,592,599 B2 | 9/2009 | Kameshima | |
| 7,626,156 B2 | 12/2009 | Tada et al. | |
| 7,674,650 B2 | 3/2010 | Akimoto et al. | |
| 7,683,408 B2 * | 3/2010 | Hong | H01L 27/1463 257/292 |
| 7,732,819 B2 | 6/2010 | Akimoto et al. | |
| 7,755,118 B2 | 7/2010 | Inoue | |
| 7,808,535 B2 | 10/2010 | Kimura | |
| 7,923,696 B2 | 4/2011 | Kameshima | |
| 8,081,175 B2 | 12/2011 | Chen | |
| 8,159,010 B2 | 4/2012 | Inoue | |
| 8,203,636 B2 | 6/2012 | Kimura | |
| 8,355,065 B2 | 1/2013 | Kimura | |
| 8,743,250 B2 | 6/2014 | Kimura | |
| 2001/0030704 A1 | 10/2001 | Kimura | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0253790 A1 | 11/2005 | Uchida | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den | |
| 2006/0113565 A1 | 6/2006 | Abe et al. | |
| 2006/0119719 A1 | 6/2006 | Kameshima | |
| 2006/0157760 A1 | 7/2006 | Hayashi et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0018075 A1 | 1/2007 | Cazaux et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0054319 A1 | 3/2008 | Mouli | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0032824 A1 | 2/2009 | Suzumura et al. | |
| 2009/0068773 A1 | 3/2009 | Lai et al. | |
| 2009/0072122 A1 * | 3/2009 | Tada | H01L 27/14647 250/208.1 |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0261389 A1 | 10/2009 | Cho et al. | |
| 2009/0278122 A1 | 11/2009 | Hosono et al. | |

(56) References Cited

U.S. PATENT DOCUMENTS

| | | | |
|---|---|---|---|
| 2009/0280600 | A1 | 11/2009 | Hosono et al. |
| 2009/0295769 | A1 | 12/2009 | Yamazaki et al. |
| 2009/0309035 | A1 | 12/2009 | Kameshima |
| 2010/0025677 | A1 | 2/2010 | Yamazaki et al. |
| 2010/0044711 | A1 | 2/2010 | Imai |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0238135 | A1 | 9/2010 | Brown et al. |
| 2011/0109532 | A1 | 5/2011 | Choi |
| 2011/0176038 | A1 | 7/2011 | Kurokawa et al. |
| 2011/0198483 | A1 | 8/2011 | Kurokawa |
| 2011/0198484 | A1 | 8/2011 | Kurokawa |
| 2014/0217287 | A1 | 8/2014 | Kimura |

FOREIGN PATENT DOCUMENTS

| | | |
|---|---|---|
| CN | 001669296 A | 9/2005 |
| CN | 001883191 A | 12/2006 |
| CN | 101467443 A | 6/2009 |
| EP | 1154310 A | 11/2001 |
| EP | 1566842 A | 8/2005 |
| EP | 1677514 A | 7/2006 |
| EP | 1737044 A | 12/2006 |
| EP | 2226847 A | 9/2010 |
| EP | 2544238 A | 1/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-180071 A | 7/1990 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-238132 A | 8/2001 |
| JP | 2001-292276 A | 10/2001 |
| JP | 2001-308306 A | 11/2001 |
| JP | 2002-076356 A | 3/2002 |
| JP | 2002-246580 A | 8/2002 |
| JP | 2002-289859 A | 10/2002 |
| JP | 2003-086000 A | 3/2003 |
| JP | 2003-086808 A | 3/2003 |
| JP | 2004-045636 A | 2/2004 |
| JP | 2004-103957 A | 4/2004 |
| JP | 2004-273614 A | 9/2004 |
| JP | 2004-273732 A | 9/2004 |
| JP | 2005-175418 A | 6/2005 |
| JP | 2005-183921 A | 7/2005 |
| JP | 2005-236013 A | 9/2005 |
| JP | 2006-191236 A | 7/2006 |
| JP | 2006-345330 A | 12/2006 |
| JP | 2007-258223 A | 10/2007 |
| JP | 2009-033002 A | 2/2009 |
| JP | 2009-071057 A | 4/2009 |
| JP | 4325557 | 9/2009 |
| JP | 2009-540628 | 11/2009 |
| JP | 2010-016072 A | 1/2010 |
| JP | 4403687 | 1/2010 |
| JP | 2010-056541 A | 3/2010 |
| JP | 2011-211182 A | 10/2011 |
| JP | 5116897 | 1/2013 |
| KR | 2009-0018159 A | 2/2009 |
| KR | 2010-0014167 A | 2/2010 |
| WO | WO-2004/008736 | 1/2004 |
| WO | WO 2004/114391 | 12/2004 |
| WO | WO-2005/050982 | 6/2005 |
| WO | WO-2007/145346 | 12/2007 |
| WO | WO-2009/096608 | 8/2009 |
| WO | WO-2011/111529 | 9/2011 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m= 3, 4, and 5), InGaO3(ZnO)3, and Ga2O3(ZnO)m (m= 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper: Fast Electro-Optical Switching in Polymer-Stabilized Liquid Crystalline Blue Phase for Display

(56) References Cited

OTHER PUBLICATIONS

Application", SID Digest '07 : SID International Symposium of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn-O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-

(56) References Cited

OTHER PUBLICATIONS

FPD '08 Digest of Technical Papers, Jul. 2, 2008, pp. 251-252, The Japan Society of Applied Physics.

Mo.Y et al "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

International Search Report (Application No. PCT/JP2011/054052) dated May 31, 2011.

Written Opinion (Application No. PCT/JP2011/054052) dated May 31, 2011.

Chinese Office Action (Application No. 201180013659.5) dated Nov. 15, 2014.

Chinese Office Action (Application No. 201510606903.9) dated Sep. 22, 2017.

\* cited by examiner

SEMICONDUCTOR DEVICE

TECHNICAL FIELD

The technical field relates to a photosensor and a driving method thereof. The technical field also relates to a display device including a photosensor and a driving method thereof. Further, the technical field relates to a semiconductor device including a photosensor and a driving method thereof.

BACKGROUND ART

In recent years, a display device provided with a light-detecting sensor (also referred to as a photosensor) has attracted attention. In the display device including a photosensor, a display screen also serves as an input region. A display device having an image capture function is an example of such a display device (see Patent Document 1, for example).

Examples of a semiconductor device including a photosensor are a CCD image sensor and a CMOS image sensor. Such image sensors are used in, for example, electronic appliances like digital still cameras or cellular phones.

In a display device provided with a photosensor, first, light is emitted from the display device. When the light enters a region where an object exists, the light is blocked by the object, and is partly reflected. The light reflected by the object is detected by the photosensor provided in a pixel in the display device. Thus, the existence of the object in the pixel area can be recognized.

In a semiconductor device with a photosensor, light emitted from an object or external light reflected by the object is detected by the photosensor directly or is detected after the light is gathered by an optical lens or the like.

REFERENCE

[Patent Document 1] Japanese Published Patent Application No. 2001-292276

DISCLOSURE OF INVENTION

In a semiconductor device with a photosensor, a circuit with a transistor is formed in each pixel in order that electric signals that a photosensor in each pixel has generated by detecting light may be collected.

A semiconductor device with a photosensor includes a read control transistor for converting an output signal based on incident light into a voltage signal. It is possible to convert an output signal based on incident light into a voltage signal by resistive division of a transistor in a photosensor and a read control transistor being regarded as resistors.

In a semiconductor device with a photosensor, a read control transistor can be a transistor using amorphous silicon or polycrystalline silicon. However, off-state current, which is current flowing through a transistor being in the off-state, passes through a transistor using amorphous silicon or polycrystalline silicon. This contributes to the fact that the power consumption of the semiconductor device with a photosensor increases with time in a period when a read operation is not performed.

An object of one embodiment of the present invention is to provide a semiconductor device the photosensor of which can achieve low power consumption.

One embodiment of the present invention is a semiconductor device including: a photosensor including a photodiode, a first transistor, and a second transistor; and a read control circuit including a read control transistor. The photodiode has a function of supplying charge based on incident light to a gate of the first transistor. The first transistor has a function of storing charge supplied to its gate and converting the charge stored into an output signal. The second transistor has a function of controlling reading of the output signal. The read control transistor functions as a resistor converting the output signal into a voltage signal. Semiconductor layers of the first transistor, the second transistor, and the read control transistor are formed using an oxide semiconductor.

One embodiment of the present invention is a semiconductor device including: a photosensor including a photodiode, a first transistor, a second transistor, and a third transistor; and a read control circuit including a read control transistor. The photodiode has a function of supplying charge based on incident light to a gate of the first transistor. The first transistor has a function of storing charge supplied to its gate and converting the charge stored into an output signal. The second transistor has a function of keeping the charge stored on the gate of the first transistor. The third transistor has a function of controlling reading of the output signal. The read control transistor functions as a resistor converting the output signal into a voltage signal. Semiconductor layers of the first transistor, the second transistor, the third transistor, and the read control transistor are formed using an oxide semiconductor.

One embodiment of the present invention is a semiconductor device including: a photosensor including a photodiode, a first transistor, and a second transistor; and a read control circuit including a read control transistor. The photodiode has a function of supplying charge based on incident light to a gate of the first transistor. The first transistor has a function of storing charge supplied to its gate and converting the charge stored into an output signal. The second transistor has a function of controlling reading of the output signal. The read control transistor functions as a resistor converting the output signal into a voltage signal. Semiconductor layers of the first transistor, the second transistor, and the read control transistor are formed using an oxide semiconductor. A voltage applied to a gate of the read control transistor is changed in accordance with the output signal, thereby changing resistance of the read control transistor.

One embodiment of the present invention is a semiconductor device including: a photosensor including a photodiode, a first transistor, a second transistor, and a third transistor; and a read control circuit including a read control transistor. The photodiode has a function of supplying charge based on incident light to a gate of the first transistor. The first transistor has a function of storing charge supplied to its gate and converting the charge stored into an output signal. The second transistor has a function of keeping the charge stored on the gate of the first transistor. The third transistor has a function of controlling reading of the output signal. The read control transistor functions as a resistor converting the output signal into a voltage signal. Semiconductor layers of the first transistor, the second transistor, the third transistor, and the read control transistor are formed using an oxide semiconductor. A voltage applied to a gate of the read control transistor is changed in accordance with the output signal, changing resistance of the read control transistor.

In one embodiment of the present invention, a plurality of the photosensors is formed; the photosensor has a function of performing a reset operation, a storage operation, and a read operation; the plurality of the photosensors have a function of concurrently performing the reset operation, concurrently performing the storage operation, and sequentially performing the read operation.

The semiconductor device refers to an element having a semiconductor property and to all the objects having the element. For example, a display device having a transistor is simply referred to as a semiconductor device in some cases.

The present invention can provide a semiconductor device the photosensors of which can achieve low power consumption.

BEST MODE FOR CARRYING OUT THE INVENTION

Figure 1A:
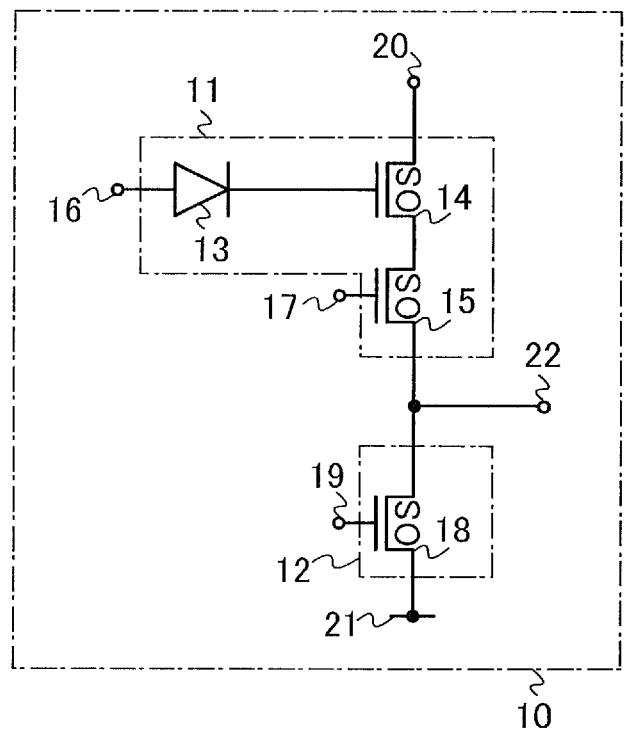
FIGS. 1A and 1B are a circuit diagram and a timing diagram for describing one embodiment of the present invention.

Embodiments of the present invention will be hereinafter described with reference to the drawings. However, the present invention can be carried out in many different modes, and it is easily understood by those skilled in the art that modes and details of the present invention can be changed in various ways without departing from the purpose and the scope of the present invention. Therefore, the present invention should not be interpreted as being limited to the description of the embodiments. Note that identical portions or portions having the same function in all drawings showing the structure of the invention that are described below are denoted by the same reference numerals.

Note that the size, the thickness of a layer, the signal waveform, or the region of each structure shown in drawings or the like of the embodiments is exaggerated for simplicity in some cases. Therefore, the embodiments of the present invention are not limited to such scales.

Note that terms such as first, second, third to Nth (N is a natural number) employed in this specification are used in order to avoid confusion between components and do not set a limitation on number.

(Embodiment 1)

In this embodiment, an example of a semiconductor device which is one embodiment of the disclosed invention will be described with reference to FIGS. 1A and 1B and FIG. 2.

FIG. 1A shows an example of the circuit configuration of a photosensor 11 included in a semiconductor device 10 and an example of the configuration of a read control circuit 12 connected to the photosensor 11.

The photosensor 11 includes a photodiode 13, a transistor 14 (also referred to as a first transistor), and a transistor 15 (also referred to as a second transistor). The read control circuit 12 includes a transistor 18 (also referred to as a read control transistor).

In the photosensor 11, one electrode of the photodiode 13 is connected to a photodiode reset line 16 and the other electrode is connected to a gate of the transistor 14. One of a source and a drain of the transistor 14 is connected to a photosensor reference high supply line 20, and the other of the source and the drain is connected to one of a source and a drain of the transistor 15. A gate of the transistor 15 is connected to a gate line 17, and the other of the source and the drain of the transistor 15 is connected to a photosensor output line 22.

In the read control circuit 12, one of a source and a drain of the transistor 18 is connected to the other of the source and the drain of the transistor 15 and the photosensor output line 22, and the other of the source and the drain is connected to a photosensor reference low supply line 21. A gate of the transistor 18 is connected to a photosensor selection line 19.

Note that in circuit diagrams in this specification, a transistor having an oxide semiconductor layer is denoted by a symbol "OS" so that it can be identified as a transistor having an oxide semiconductor layer. For example, in FIG. 1A, the transistor 14, the transistor 15, and the transistor 18 are transistors having semiconductor layers of an oxide semiconductor.

The transistor 14, the transistor 15, and the transistor 18 have an oxide semiconductor in their semiconductor layers. When the above transistors have semiconductor layers of an oxide semiconductor, their off-state current, which is current flowing through a transistor being in the off state (being off) can be extremely low.

Figure 10A:
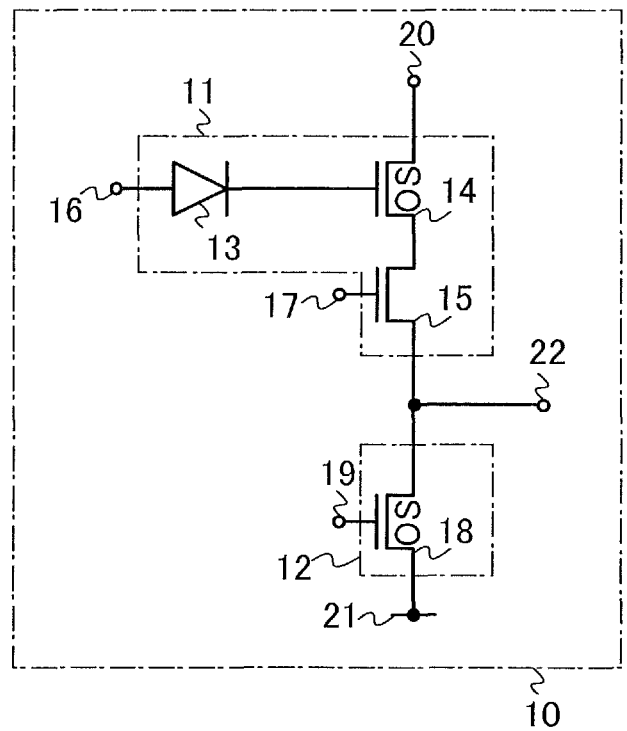
FIGS. 10A and 10B are circuit diagrams for describing one embodiment of the present invention.
Figure 10B:
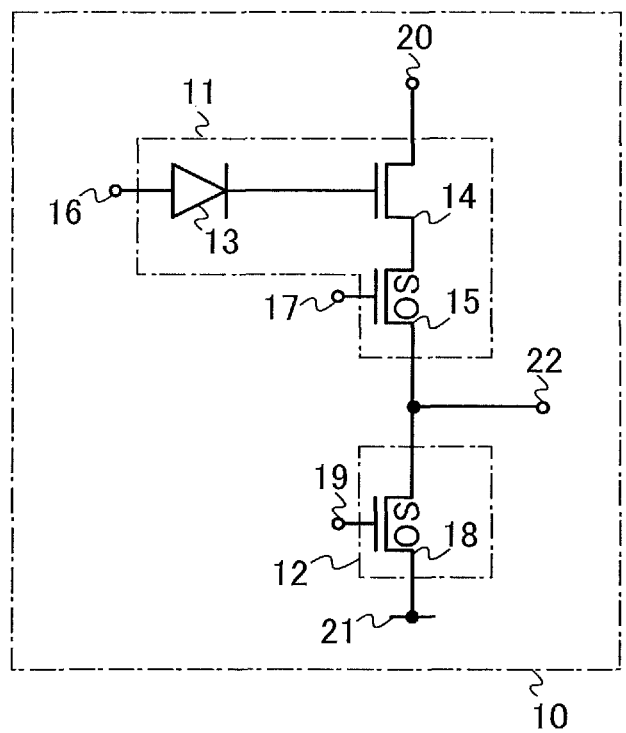

Note that either of the semiconductor layer of the transistor 14 and that of the transistor 15 is formed using an oxide semiconductor. Specifically, the transistor 14 may be a transistor using an oxide semiconductor as shown in FIG. 10A; alternatively, the transistor 15 may be a transistor using an oxide semiconductor as shown in FIG. 10B. Examples of a semiconductor used in the semiconductor layers of the transistor 14 and the transistor 15 except an oxide semiconductor include an amorphous silicon semiconductor, a microcrystalline silicon semiconductor, a polycrystalline silicon semiconductor, and a single crystal silicon semiconductor. The transistor 14 in particular, which has a function of converting charge from the photodiode 13 into an output signal, preferably uses a single crystal semiconductor to have a high mobility.

Note that the meaning of the description that explicitly states "A and B are connected to each other" includes "A and B are electrically connected to each other", "A and B are functionally connected to each other", and "A and B are directly connected to each other".

A signal is supplied to the photodiode reset line 16 and the gate line 17 by a photosensor driver circuit. The photosensor driver circuit supplies a signal used to perform a reset operation, a storage operation, and a read operation (also referred to as a selecting operation), which will be described later, to the photosensor 11 placed in a particular row.

The photosensor selection line 19, the photosensor reference high supply line 20, the photosensor reference low supply line 21, and the photosensor output line 22 are connected to a photosensor reading circuit. The photosensor reading circuit has a function of controlling signals input to the lines used to read an output signal of the photosensor 11 in a selected row.

Note that the photosensor reading circuit allows, by using an OP amplifier, an output signal of the photosensor, which is an analog signal, to be output to an external unit through the photosensor output line 22 in the form of an analog signal or to be output to an external unit after being converted into a digital signal by an A/D converter circuit.

The photodiode 13 can be a PN diode, a PIN diode, a Schottky diode, or an avalanche diode. In the case where a PN diode or a PIN diode is used as the photodiode 13, applicable diode is that in which semiconductors with the corresponding conductivity types (a combination of p-type conductivity and n-type conductivity or a combination of p-type conductivity, i-type conductivity, and n-type conductivity) are stacked; or that in which semiconductors with the corresponding conductivity types lie in the same plane. A semiconductor used in the photodiode 13 can be an amorphous semiconductor, a microcrystalline semiconductor, a polycrystalline semiconductor, a single crystal semiconductor, or the like. The photodiode has a function of generating an electric signal in accordance with the intensity of light. Incident light on the photodiode is light reflected by an object or light emitted from an object. A source of light which is to be reflected by an object can be a lighting device included in the semiconductor device or external light.

The transistor 14 has a function of accumulating (storing) charge in its gate. By the charge stored in the gate, the value of a voltage applied between the gate and a source of the transistor 14 and the value of resistance between the source and a drain of the transistor 14 are varied. Then, resistive division between the photosensor reference high supply line 20 and the photosensor reference low supply line 21 is made, so that the photosensor output line 22 can have a voltage value based on incident light.

The transistor 15 has a function of controlling reading of an output signal of the photosensor 11. Specifically, the transistor 15 has a function of transferring an output signal of the photosensor 11 to the photosensor output line 22. Therefore, the transistor 15 is required to be a switch which reads an output signal at high speed by controlling electrical connection between terminals.

It is preferable that the transistor 14 and the transistor 15 minimize, in a period when a read operation is performed on another photosensor that is connected to the same photosensor output line 22, a current flowing between the photosensor output line 22 and the photosensor reference high supply line 20 and thus do not contribute to variations in the potential of the photosensor output line 22. For this reason, the transistor 14 and the transistor 15 are preferably transistors with a low off-state current.

In the structure of this embodiment, the transistors used in the photosensor 11 have semiconductor layers of an oxide semiconductor and thus can have an extremely low off-state current, as shown in FIG. 1A. Thus, these transistors minimize a current flowing between the photosensor output line 22 and the photosensor reference high supply line 20 in a period when a read operation is performed on another photosensor that is connected to the same photosensor output line 22 and thus do not contribute to variations in the potential of the photosensor output line 22.

Next, the read control circuit 12 will be described. The read control circuit 12 shown in FIG. 1A is used for a single column of the photosensors 11. The read control circuit 12 for a signal row of the photosensors 11 includes the transistor 18.

In the read control circuit 12, a signal output to the photosensor output line 22 can be converted into a voltage signal by resistive division between the transistor 14, in which resistance between the source and the drain varies according to an output signal based on incident light on the photosensor 11, and the transistor 18, in which resistance between the source and the drain is set by a constant voltage from the photosensor selection line 19. In other words, the read control circuit 12 serves as a resistor for converting a signal output to the photosensor output line 22 into a voltage signal.

Note that in this embodiment, in a period except a period when the read control circuit 12 converts a signal output to the photosensor output line 22 into a voltage signal, it is preferable to achieve low power consumption by reducing a current flowing between the photosensor output line 22 and the photosensor reference low supply line 21 to extremely low in such a manner that the transistor 18 is turned off by a constant voltage applied to the transistor 18 through the photosensor selection line 19.

In the semiconductor device with a photosensor, the transistor 18 included in the read control circuit 12 has a semiconductor layer of an oxide semiconductor, and thus has an extremely low off-state current. Further, in a period except a period when the read control circuit 12 converts a signal output to the photosensor output line 22 into a voltage signal, it is possible to prevent variations in the potential of the photosensor output line 22 by reducing a current flowing between the photosensor output line 22 and the photosensor reference low supply line 21 to extremely low in such a manner that the transistor 18 is turned off by a constant voltage applied to the transistor 18 through the photosensor selection line 19.

Here, a signal to be applied to the photosensor selection line 19 is adjusted so that resistance between the source and the drain of the transistor 18 may be changed according to the resistance between the source and the drain of the transistor 14. For example, in order that the resistance between the source and the drain of the transistor 14 may be made high by a large amount of incident light on the photosensor 11, the voltage of the photosensor selection line 19 is made low so that the resistive division between the transistor 14 and the transistor 18 may yield a voltage signal output to the photosensor output line 22. In contrast, in order that the resistance between the source and the drain of the transistor 14 may be made low by a small amount of incident light on the photosensor 11, the voltage of the photosensor selection line 19 is made high so that the resistive division between the transistor 14 and the transistor 18 may yield a voltage signal output to the photosensor output line 22. As a result, it is possible to provide an inexpensive semiconductor device capable of capturing, with a high resolution, an image based on a wide range of light intensities.

Further, the semiconductor device with a photosensor according to this embodiment includes the transistor 14, the transistor 15, and the transistor 18 which have semiconductor layers of an oxide semiconductor. The off-state current of the transistors having semiconductor layers of an oxide semiconductor can be extremely low. Therefore, in a period when the photosensor does not operate, a flow-through current between the photosensor reference high supply line 20 and the photosensor reference low supply line 21 can be extremely low. This leads to lower power consumption of the semiconductor device with a photosensor.

Next, the operation of the photosensor 11 shown in FIG. 1A will be described with reference to a timing diagram of FIG. 1B. In FIG. 1B, signals 31 to 35 are the potential of the photodiode reset line 16, the potential of the gate line 17, the potential of the gate of the transistor 14, the potential of the photosensor output line 22, and the potential of the photosensor selection line 19, which are shown in FIG. 1A, respectively.

Figure 1B:
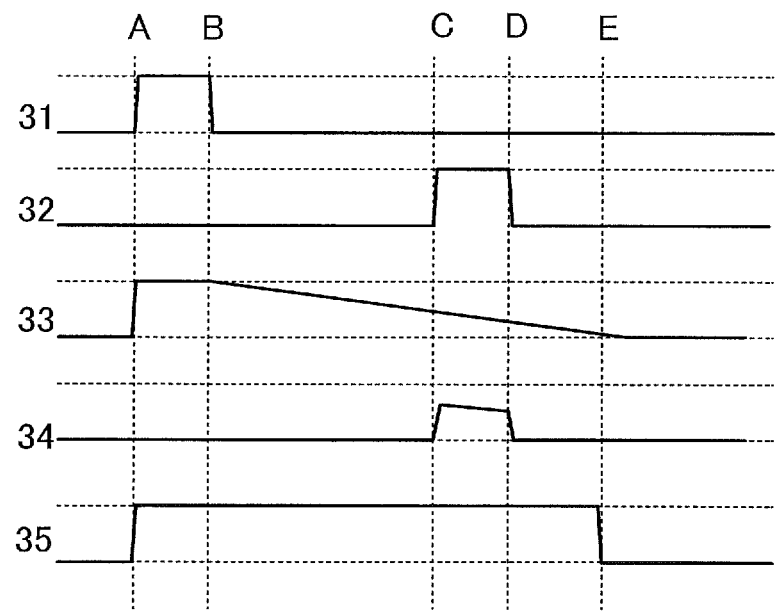

Note that the timing diagram of FIG. 1B includes a reset period when the reset operation is performed, a storage period when the charge storage operation is performed, and the read period when the read operation is performed. A period from time A to time B corresponds to the reset period. A period from the time B to time C corresponds to the storage period. A period from the time C to time D corresponds to the read period. A period from the time A to time E corresponds to the read operation period.

In FIG. 1B, a high potential is "H", and a low potential is "L". Note that in FIG. 1B, a transistor is turned off when a low-level signal is applied to the gate of the transistor. In addition, in FIG. 1B, when a high-level signal is applied to the gate of the transistor, a transistor is put into a conducting state in which resistance between the source and the drain of the transistor changes according to the magnitude of the applied potential.

At the time A, the potential of the photodiode reset line 16 (the signal 31) becomes "H" (the reset operation starts), so that the photodiode 13 conducts and the potential of the gate of the transistor 14 (the signal 33) becomes "H". The potential of the gate line 17 (the signal 32) becomes "L", so that the transistor 15 is turned off. In addition, the potential of the photosensor selection line 19 (the signal 35) becomes a predetermined value (the read operation starts), allowing the transistor 18 to function as a resistor in accordance with a voltage applied to the gate of the transistor 18. Then the transistor 14, the transistor 15, and the transistor 18 function as resistors, so that the transistor 15 has a high resistance, causing the photosensor output line 22 (the signal 34) to be at the same voltage level as the photosensor reference low supply line 21, i.e., to be at a low voltage level.

At the time B, the photodiode reset line 16 (the signal 31) goes "L" (the reset operation terminates and the storage operation starts), so that photo-current in the photodiode 13 is increased by incident light and the potential of the gate of the transistor 14 (the signal 33) is decreased in accordance with the amount of the incident light. In other words, the photodiode 13 has a function of supplying charge to the gate of the transistor 14 in accordance with incident light, and thus decreases the potential of the gate of the transistor 14. Consequently, resistance between the source and the drain of the transistor 14 is changed. Then the potential of the gate line 17 (the signal 32) becomes "L", turning off the transistor 15. Further, the potential of the photosensor selection line 19 (the signal 35) becomes a predetermined value, allowing the transistor 18 to function as a resistor in accordance with a voltage applied to the gate of the transistor 18. Then the transistor 14, the transistor 15, and the transistor 18 function as resistors, so that the transistor 15 has a high resistance, causing the photosensor output line 22 (the signal 34) to be at the same voltage level as the photosensor reference low supply line 21, i.e., to be at a low voltage value.

At the time C, the potential of the gate line 17 (the signal 32) becomes "H" (the storage operation terminates and the selecting operation starts), so that the transistor 15 is turned on. Then, the photosensor output line 22 has a voltage obtained by resistive division between the transistor 14 in which resistance between the source and the drain changes in accordance with incident light; and the transistor 18 in which resistance is determined by a constant voltage supplied by the photosensor selection line 19. Here, the magnitude of the potential of the photosensor output line 22 (the signal 34) depends on the speed at which the potential of the gate of the transistor 14 (the signal 33) decreases, that is, changes in accordance with the amount of incident light on the photodiode 13 during the storage operation. Therefore, the amount of incident light on the photodiode 13 during the storage operation can be known by obtaining the potential of the photosensor output line 22.

At the time D, the potential of the gate line 17 (the signal 32) becomes "L" (the selecting operation terminates), so that the transistor 15 is turned off. In addition, the potential of the photosensor selection line 19 (the signal 35) becomes a predetermined value, allowing the transistor 18 to function as a resistor in accordance with a voltage applied to the gate of the transistor 18. Then the transistor 14, the transistor 15, and the transistor 18 function as resistors, so that the transistor 15 has a high resistance, causing the photosensor output line 22 (the signal 34) to be at the same voltage level as the photosensor reference low supply line 21, i.e., to be at a low voltage level.

At the time E, the potential of the photosensor selection line 19 (the signal 35) is changed from the predetermined value to a value at which the transistor 18 is turned off (the read operation terminates). As a result, turning off the transistor 15 and the transistor 18 reduces a flow-through current caused in a period when the read operation is not performed and between the photosensor reference high supply line 20 and the photosensor reference low supply line 21.

Note that the potential of the photosensor selection line 19 (the signal 35) needs to be "H" at least in a period when the potential of the gate line 17 (the signal 32) is "H" i.e., a period when the selecting operation is performed; In FIG. 1B, the potential of the photosensor selection line 19 (the signal 35) may be "L" during the period from the time A to the time C.

Figure 2:
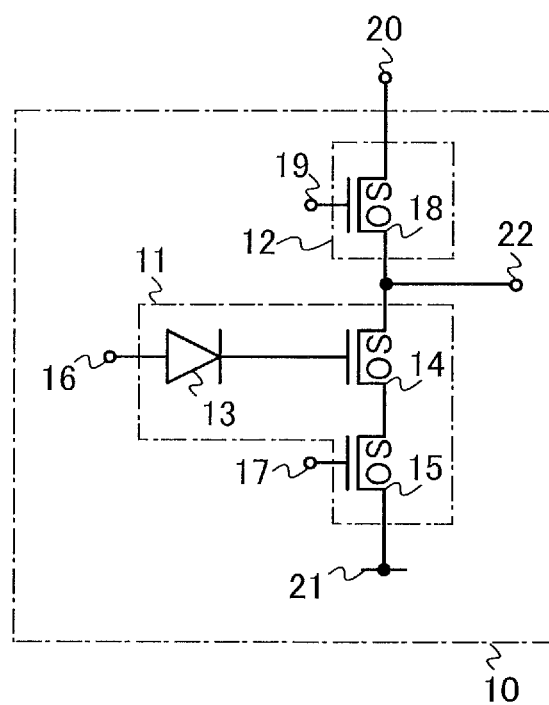
FIG. 2 is a circuit diagram for describing one embodiment of the present invention.

For the above-described configuration shown in FIG. 1A, the position of the read control circuit 12 can be changed from the photosensor reference low supply line 21 side to the photosensor reference high supply line 20 side, as shown in FIG. 2.

Note that when the intensity of incident light on the photodiode 13 is high, resistance between the source and the drain becomes high. Consequently, the potential of the photosensor output line 22 (the signal 34) decreases from "H" on a large scale, and thus becomes approximately the same value as the potential of the photosensor reference low supply line 21. For this reason, when the intensity of the light is high, variations in the potential set in accordance with the output signal are not distinguished. In this case, the potential of the photosensor selection line 19 (the signal 35) is reduced, increasing resistance between the source and the drain of the transistor 18; thus, the photosensor output line 22 can have a voltage value which is obtained by resistive division and is based on the incident light.

The above operation has been described assuming that the intensity of incident light on the photodiode 13 is high, but it can be also used in the case where the intensity of the incident light on the photodiode is low. When the light is faint, resistance between the source and the drain is low. Hence, the photosensor output line 22 and the photosensor reference high supply line 20 become approximately at the same potential, so that variations in a potential determined according to an output signal are not distinguished. In this case, the potential of the photosensor selection line 19 (the signal 35) is increased, increasing resistance between the source and the drain of the transistor 18; thus, the photosensor output line 22 can have a voltage value which is obtained by resistive division and is based on the incident light.

In other words, in this embodiment, resistance between the source and the drain of the transistor 18 can be easily increased or decreased by increasing or decreasing the potential of the photosensor selection line 19 (the signal 35). This enables a photosensor capable of converting either strong light or weak light into an electric signal with accuracy. Consequently, it is possible to provide the semiconductor device 10 including a photosensor capable of outputting electric signals on the basis of a wide range of light intensities.

As described above, the operation of individual photosensors is achieved by repeatedly performing, in the read operation period, the reset operation, the storage operation, and the selecting operation. As stated above, it is preferable that the off-state current of the transistor 14, the transistor 15, and the transistor 18 be made extremely low by the use of an oxide semiconductor. The semiconductor device 10 can achieve low power consumption when its flow-through current which occurs during non-operating period is reduced.

Such a semiconductor device including a photosensor can be used in an electronic appliance such as a scanner or a digital still camera. In addition, the semiconductor device including the photosensor can be used in a display device having a touch panel function.

This embodiment can be implemented in appropriate combination with any of the other embodiments.

(Embodiment 2)

In this embodiment, an example of the semiconductor device, which is one embodiment of the disclosed invention, will be described with reference to FIGS. 3A and 3B. This example has a different structure from Embodiment 1. Note that in this embodiment, the same components as those in FIG. 1A used in Embodiment 1 are denoted by the same reference numerals as those in FIG. 1A and will not be described again.

Figure 3A:
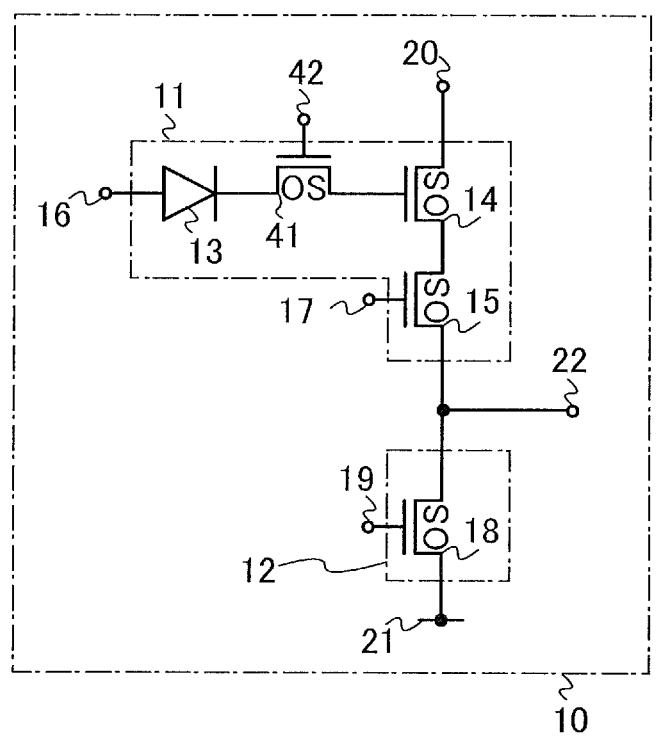
FIGS. 3A and 3B are a circuit diagram and a timing diagram for describing one embodiment of the present invention.

The semiconductor device 10 shown in FIG. 3A is different from that shown in FIG. 1A in having a transistor 41 (also referred to as a third transistor) between the gate of the transistor 14 and the other electrode of the photodiode 13. The gate of the transistor 41 is connected to a gate line 42.

The transistor 41 has a function of controlling the storage operation performed by the photosensor 11. That is, the transistor 41 has a function of transferring an electric signal generated by the photodiode 13 to the gate of the transistor 14 when being on. In addition, the transistor 41 has a function of keeping charge accumulated (stored) on the gate of the transistor 14 when being off. For this reason, a transistor with an extremely low off-state current is desirably used as the transistor 41.

Therefore, a semiconductor layer forming the channel formation region of the transistor 41 preferably is formed using an oxide semiconductor with a very low off-state current and relatively high mobility like the transistor 14, the transistor 15, and the transistor 18. A transistor formed using an oxide semiconductor has an electrical characteristic of much lower off-state current than a transistor formed using silicon or the like.

Note that between the semiconductor layers of the transistor 14 and the transistor 15, either of them is formed using an oxide semiconductor.

Next, the operation of the photosensor 11 shown in FIG. 3A will be described with reference to a timing diagram of FIG. 3B. In FIG. 3B, signals 51 to 56 are the potential of the photodiode reset line 16, the potential of the gate line 42, the potential of the gate line 17, the potential of the gate of the transistor 14, the potential of the photosensor output line 22, and the potential of the photosensor selection line 19, which are shown in FIG. 3A, respectively.

Figure 3B:
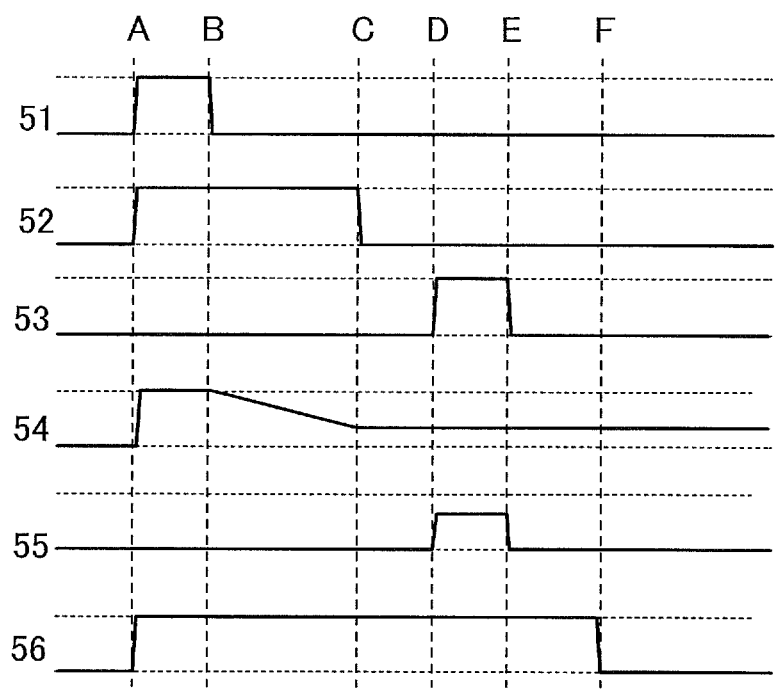

Note that the timing diagram of FIG. 3B includes a reset period when the reset operation is performed, a storage period when the charge storage operation is performed, and the read period when the read operation is performed. A period from time A to time B corresponds to the reset period. A period from the time B to time C corresponds to the storage period. A period from the time D to time E corresponds to the read period. A period from the time A to time F corresponds to the read operation period.

In FIG. 3B, a high potential is "H", and a low potential is "L". Note that in FIG. 3B, a transistor is turned off when a low-level signal is applied to the gate of the transistor. In addition, in FIG. 3B, when a high-level signal is applied to the gate of the transistor, a transistor is put into a conducting state in which resistance between the source and the drain of the transistor changes according to the magnitude of the applied potential.

At the time A, the potential of the photodiode reset line 16 (the signal 51) becomes "H" and the potential of the gate line 42 (the signal 52) becomes "H" (the reset operation starts), so that the photodiode 13 and the transistor 41 conduct and the potential of the gate of the transistor 14 (the signal 54) becomes "H". The potential of the gate line 17 (the signal 53) becomes "L", thereby turning off the transistor 15. In addition, the potential of the photosensor selection line 19 (the signal 56) becomes a predetermined value (the read operation starts), allowing the transistor 18 to function as a resistor in accordance with a voltage applied to the gate of the transistor 18. Then the transistor 14, the transistor 15, and the transistor 18 function as resistors, so that the transistor 15 has a high resistance, causing the photosensor output line 22 (the signal 55) to be at the same voltage level as the photosensor reference low supply line 21, i.e., to be at a low voltage value.

At the time B, the potential of the photodiode reset line 16 (the signal 51) becomes "L" and the potential of the gate line 42 (the signal 52) remains to be "H" (the reset operation terminates and the storage operation starts), so that photocurrent in the photodiode 13 is increased by incident light and the potential of the gate of the transistor 14 (the signal 54) is decreased in accordance with the amount of the incident light. In other words, the photodiode 13 has a function of supplying charge to the gate of the transistor 14 in accordance with the incident light, and thus decreases the potential of the gate of the transistor 14. Consequently, resistance between the source and the drain of the transistor 14 is changed. Then the potential of the gate line 17 (the signal 53) becomes "L", turning off the transistor 15. Further, the potential of the photosensor selection line 19 (the signal 56) becomes a predetermined value, allowing the transistor 18 to function as a resistor in accordance with a voltage applied to the gate of the transistor 18. Then the transistor 14, the transistor 15, and the transistor 18 function as resistors, so that the transistor 15 has a high resistance, causing the photosensor output line 22 (the signal 55) to be at the same voltage level as the photosensor reference low supply line 21, i.e., to be at a low voltage level.

At the time C, the gate line 42 (the signal 52) goes "L" (the storage operation terminates), turning off the transistor

41. Then, the potential of the gate of the transistor 14 (the signal 54) becomes constant, that is, the amount of charge accumulated (stored) on the gate of the transistor 14 becomes constant. The potential (the amount of the charge) of the gate of the transistor 14 is determined by the amount of the photocurrent generated by the photodiode during the storage operation. In other words, the potential (the amount of the charge) of the transistor 14 is changed in accordance with the intensity of the incident light on the photodiode.

Note that when the gate line 42 (the signal 52) goes "L", the potential (the amount of the charge) of the gate of the transistor 14 is changed by parasitic capacitance between the gate line 42 and the gate of the transistor 14. When the amount of change in the potential (the amount of the charge) due to the parasitic capacitance is large, the read operation cannot be performed with accuracy. In order that the amount of change in the potential (the amount of the charge) due to the parasitic capacitance may be reduced, it is effective to take a measure for reducing capacitance between the gate and the source (or between the gate and the drain) of the transistor 41, a measure for increasing the gate capacitance of the transistor 14, a measure for providing the gate line 42 with a storage capacitor, or the like. Note that in FIGS. 3A and 3B, these measures are taken and change in the potential (the amount of the charge) due to the parasitic capacitance can be thus ignored.

At the time D, the gate line 17 (the signal 53) goes "H" (the selecting operation starts), so that the transistor 15 is turned on. Then, the photosensor output line 22 has a voltage obtained by resistive division between the transistor 14 in which resistance between the source and the drain changes in accordance with incident light; and the transistor 18 in which resistance is determined by a constant voltage supplied by the photosensor selection line 19. Here, the magnitude of the potential of the photosensor output line 22 (the signal 55) depends on the potential of the gate of the transistor 14 (the signal 54) decreases, that is, changes in accordance with the amount of incident light on the photodiode 13 during the storage operation. Therefore, the amount of incident light on the photodiode 13 during the storage operation can be known by obtaining the potential of the photosensor output line 22.

At the time E, the gate line 17 (the signal 53) goes "L" (the selecting operation terminates), turning off the transistor 15. In addition, the potential of the photosensor selection line 19 (the signal 56) becomes a predetermined value, allowing the transistor 18 to function as a resistor in accordance with a voltage applied to the gate of the transistor 18. Then the transistor 14, the transistor 15, and the transistor 18 function as resistors, so that the transistor 15 has a high resistance, causing the photosensor output line 22 (the signal 55) to have the same voltage level as the photosensor reference low supply line 21, i.e., to be low.

At the time F, the potential of the photosensor selection line 19 (the signal 56) is changed from the predetermined value to a value at which the transistor 18 is turned off (the read operation terminates). As a result, turning off the transistor 15 and the transistor 18 reduces a flow-through current between the photosensor reference high supply line 20 and the photosensor reference low supply line 21.

Note that the photosensor selection line 19 (the signal 56) needs to go "H" at least in a period when the gate line 17 (the signal 53) is "H" i.e., a period when the selecting operation is performed; In FIG. 3B, the photosensor selection line 19 (the signal 35) may be "L" during the period from the time A to the time D.

Note that when the intensity of incident light on the photodiode 13 is high, resistance between the source and the drain becomes high. Consequently, the potential of the photosensor output line 22 (the signal 55) decreases from "H" on a large scale, and thus becomes approximately the same value as the potential of the photosensor reference low supply line 21. For this reason, when the intensity of the light is high, variations in the potential set in accordance with the output signal are not distinguished. In this case, the potential of the photosensor selection line 19 (the signal 56) is reduced, increasing resistance between the source and the drain of the transistor 18; thus, the photosensor output line 22 can have a voltage value which is obtained by resistive division and is based on the incident light.

The above operation is described assuming that the intensity of incident light on the photodiode 13 is high, but it can be also used in the case where the intensity of the incident light on the photodiode is low. When the light is faint, resistance between the source and the drain is low. Hence, the photosensor output line 22 and the photosensor reference high supply line 20 become approximately at the same potential, so that variations in a potential determined according to an output signal are not distinguished. In this case, the potential of the photosensor selection line 19 (the signal 56) is increased, increasing the resistance of the transistor 18; thus, the photosensor output line 22 can have a voltage value which is obtained by resistive division and is based on the incident light.

In other words, in this embodiment, resistance between the source and the drain of the transistor 18 can be easily increased or decreased by increasing or decreasing the potential of the photosensor selection line 19 (the signal 56), as in Embodiment 1. This enables a photosensor capable of converting either strong light or weak light into an electric signal with accuracy. Consequently, it is possible to provide the semiconductor device 10 including a photosensor capable of outputting electric signals on the basis of a wide range of light intensities.

Unlike Embodiment 1, this embodiment enables the potential of the gate of the transistor 14 in each photosensor to be maintained at a constant value even after the storage operation. Specifically, in this embodiment the semiconductor layer of the transistor 41 is formed using an oxide semiconductor, allowing the transistor to have an extremely low off-state current. In addition, the photosensor 11 can convert incident light into an electric signal with accuracy.

As described above, the operation of individual photosensors is achieved by repeatedly performing, in the read operation period, the reset operation, the storage operation, and the selecting operation. As stated above, it is preferable that the off-state current of the transistor 14, the transistor 15, and the transistor 18 be made extremely low by the use of an oxide semiconductor. The semiconductor device 10 can achieve low power consumption when its flow-through current that occurs during non-operating period is reduced.

This embodiment can be implemented in appropriate combination with any of the other embodiments.

(Embodiment 3)

In this embodiment, a display device, which is a semiconductor device including a photosensor, will be described with reference to FIG. 4 and FIG. 5.

The structure of the display device will be described with reference to FIG. 4. A display device 100 includes a pixel circuit 101, a display element control circuit 102, and a photosensor control circuit 103.

The pixel circuit 101 includes a plurality of pixels 104 arranged in a matrix i.e., in the row and column directions.

Each of the pixels 104 includes a display element 105 and a photosensor 106. The photosensor is not necessarily provided in each of the pixels 104, and may be provided in every two or more pixels 104. Alternatively, the photosensor may be provided outside the pixels 104.

The display element control circuit 102 is a circuit controlling the display elements 105, and includes a display element driver circuit 107 from which a signal such as video data is input to the display elements 105 through signal lines (also referred to as video-data lines or source lines); and a display element driver circuit 108 from which a signal is input to the display elements 105 through scan lines (also referred to as gate lines).

The photosensor control circuit 103 is a circuit controlling the photosensors 106, and includes a photosensor reading circuit 109 on the signal lines side and a photosensor driver circuit 110 on the scan lines side.

Figure 5:
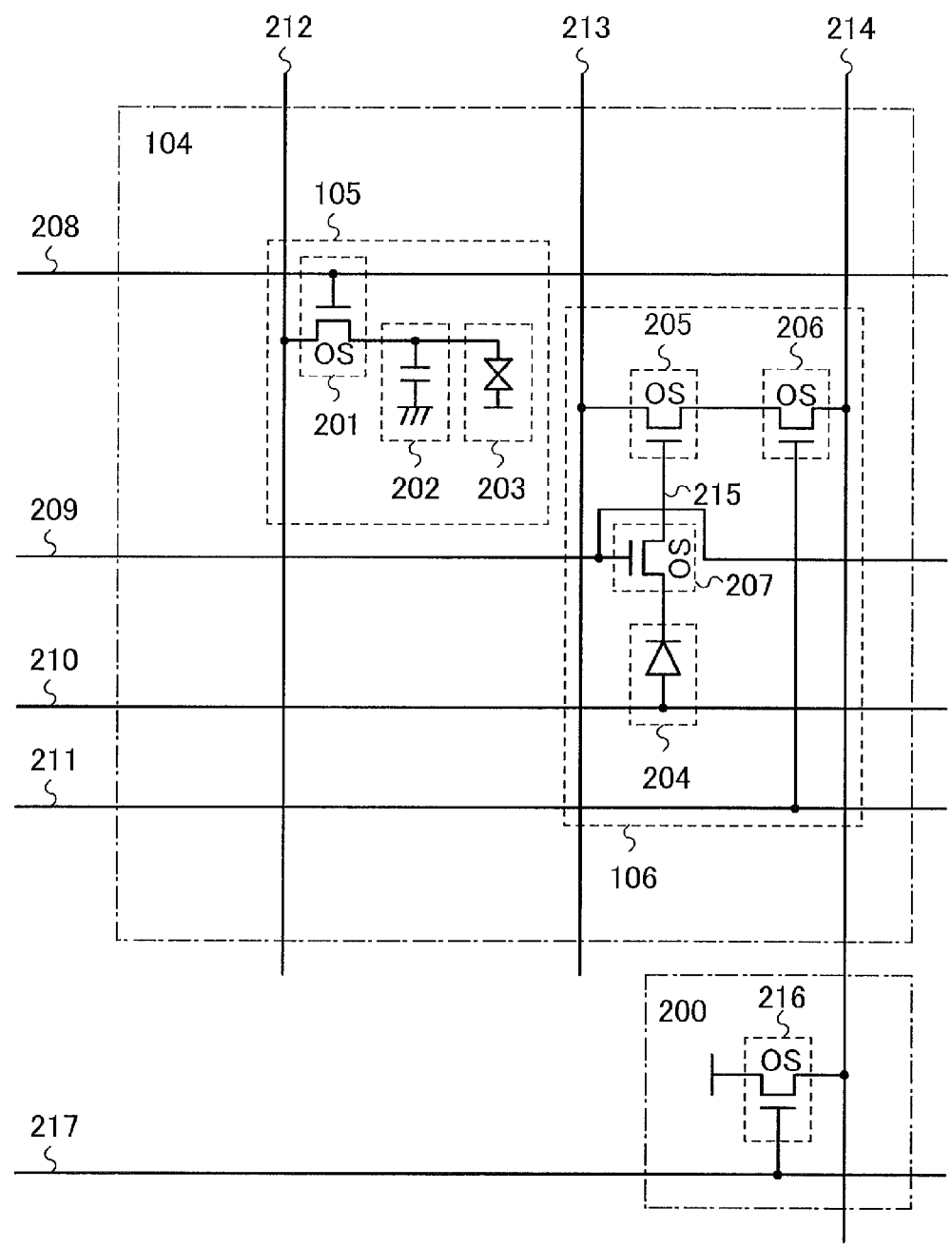
FIG. 5 is a circuit diagram for describing one embodiment of the present invention.

FIG. 5 shows an example of the circuit configuration of the pixel 104 and an example of the configuration of a read control circuit 200 connected to the pixel 104. Note that the configuration of photosensor in FIG. 3A is shown in FIG. 5 as an example of the photosensor 106 included in the pixel. The read control circuit 200 shows the configuration of the photosensor reading circuit in FIG. 3A.

The pixel 104 includes the display element 105 and the photosensor 106. The display element 105 includes a transistor 201, a storage capacitor 202, and a liquid crystal element 203.

In the display element 105, a gate of the transistor 201 is connected to a gate line 208; one of a source and a drain of the transistor 201 is connected to a video-data line 212; the other of the source and the drain is connected to one electrode of the storage capacitor 202 and one electrode of the liquid crystal element 203. The other electrode of the storage capacitor 202 and the other electrode of the liquid crystal element 203 are connected to a common wiring supplied with a predetermined potential. The liquid crystal element 203 includes a pair of electrodes and a liquid crystal layer sandwiched between the pair of electrodes.

The transistor 201 has a function of controlling injection or ejection of charge into or from the liquid crystal element 203 and the storage capacitor 202. For example, when a high potential is applied to the gate line 208, the transistor 201 is turned on and the potential of the video-data line 212 is applied to the liquid crystal element 203 and the storage capacitor 202. The contrast (gray scale) of light passing through the liquid crystal element 203 is made by the voltage application to the liquid crystal element 203, thereby producing image display. The storage capacitor 202 has a function of maintaining voltage applied to the liquid crystal element 203. The display device 100 including the liquid crystal element 203 can be a transmissive display device, a reflective display device, or a semi-transmissive display device.

Figure 4:
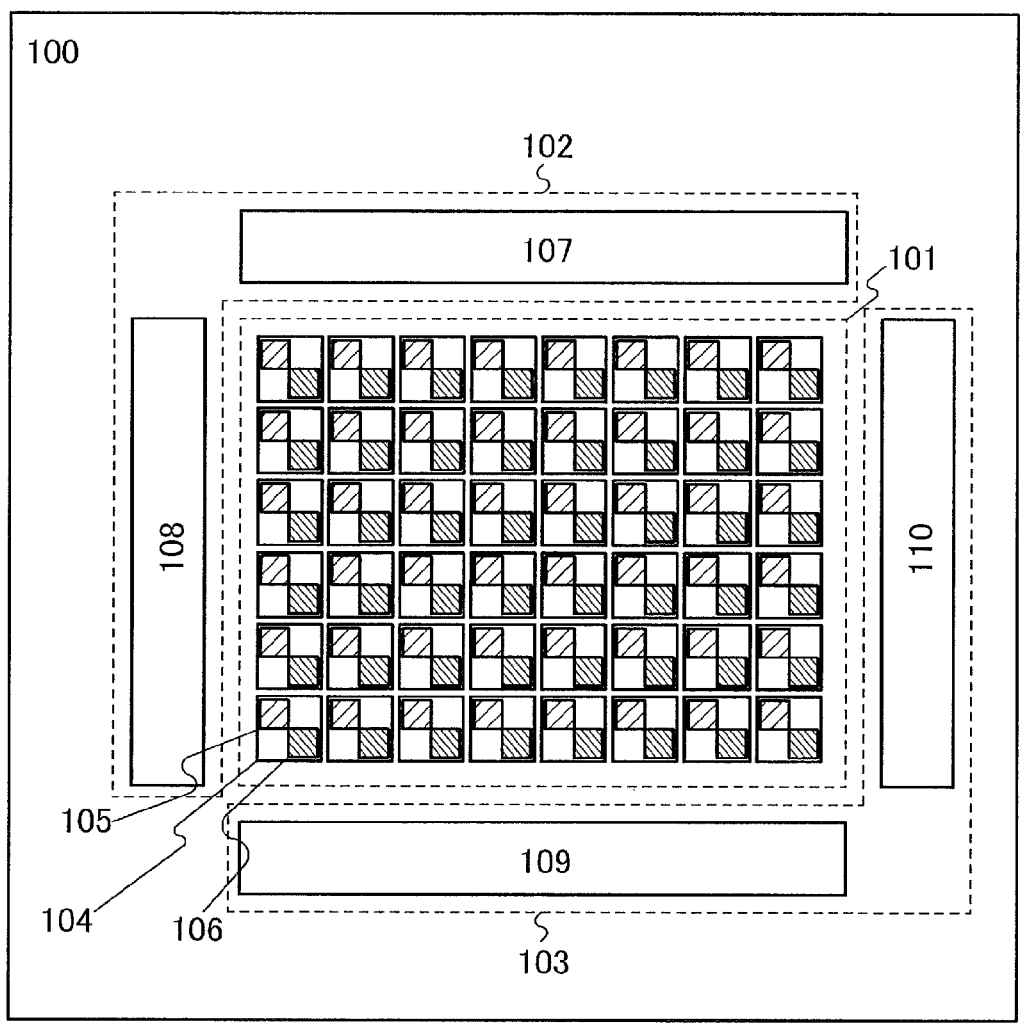
FIG. 4 is a block diagram for describing one embodiment of the present invention.

The video-data line 212 is connected to the display element driver circuit 107 shown in FIG. 4. The display element driver circuit 107 is a circuit which supplies a signal to the display element 105 through the video-data line 212. The gate line 208 is connected to the display element driver circuit 108 shown in FIG. 4. The display element driver circuit 108 is a circuit which supplies a signal to the display element 105 through the gate line 208. For example, the display element driver circuit 108 has a function of supplying a signal which selects a display element included in a pixel placed in a particular row. The display element driver circuit 107 has a function of supplying a signal which supplies appropriate potentials to a display element included in a pixel in a selected row.

The semiconductor in the channel formation region of the transistor 201 is an oxide semiconductor as described in Embodiments 1 and 2. When the transistor 201 is allowed to have an extremely low off-state current by an oxide semiconductor, a voltage applied to the liquid crystal element 203 can be held more accurately and display quality can be increased. In addition, low-power consumption can be achieved by substantially reducing the refresh rate by utilization of the transistor 201 being a transistor with an extremely low off-state current.

Although the display element 105 described here includes the liquid crystal element, the display element 105 may include another element such as a light emitting element. The light emitting element is an element whose luminance is controlled with current or voltage, and specific examples thereof include a light emitting diode and an OLED (organic light emitting diode).

The photosensor 106 includes a photodiode 204, a transistor 205 (also referred to as a first transistor), a transistor 206 (also referred to as a third transistor), and a transistor 207 (also referred to as a second transistor).

In the photosensor 106, one electrode of the photodiode 204 is connected to the photodiode reset line 210, and the other electrode of the photodiode 204 is connected to one of the source and the drain of the transistor 207. One of the source and the drain of the transistor 205 is connected to the photosensor reference line 213, and the other of the source and the drain of the transistor 205 is connected to one of the source and the drain of the transistor 206. The gate of the transistor 206 is connected to the gate line 211, and the other of the source and the drain of the transistor 206 is connected to the photosensor output line 214. The gate of the transistor 207 is connected to the gate line 209. The other of the source and the drain of the transistor 207 is connected to the gate of the transistor 205 (a node 215).

The gate line 209, the photodiode reset line 210, and the gate line 211 are connected to the photosensor driver circuit 110 shown in FIG. 4. The photosensor driver circuit 110 has a function of performing the reset operation, the storage operation, and the read operation, which will be described below, on the photosensor 106 included in a pixel placed in a particular row.

The photosensor output line 214 and the photosensor reference line 213 are connected to the photosensor reading circuit 109 shown in FIG. 4. The photosensor reading circuit 109 has a function of reading an output signal from the photosensor 106 included in a pixel in a selected row.

Note that in the photosensor reading circuit 109, an output from the photosensor which is an analog signal is extracted as an analog signal to an external unit by an OP amplifier; alternatively, an output is converted into a digital signal by an A/D converter circuit and then extracted to an external unit.

Note that, the photodiode 204, the transistor 205, the transistor 206, and the transistor 207 of this embodiment which are in the photosensor 106, are the same as the photodiode 13, the transistor 14, the transistor 15, and the transistor 41 which have been described in Embodiments 1 and 2; therefore, see the above description for their details. Further, the transistor 216 of this embodiment which is in the read control circuit 200 is the same as transistor 18 described in Embodiments 1 and 2; therefore, see the above description for its details.

This enables a photosensor capable of outputting electric signals on the basis of a wide range of light intensities. In other words, it is possible to convert either strong light or weak light into an electric signal with accuracy.

Consequently, as stated above, in the display device of this embodiment the off-state current of the transistors is made extremely low by using an oxide semiconductor for them. The semiconductor device 10 can achieve low power consumption when its flow-through current that occurs during non-operating period is reduced. Further, making the off-state current of the transistors extremely low by using an oxide semiconductor for them improves a function of maintaining charge stored on the gate of the transistors. Consequently, the photosensor can convert incident light into an electric signal with accuracy.

Although the display device having a display function and including the photosensor is described in this embodiment, this embodiment can be easily applied to a semiconductor device including a photosensor, which does not have a display function. That is, the semiconductor device can be formed by removing the circuits necessary for display, specifically the display element control circuit 102 and the display element 105, from the display device 100 in this embodiment. Examples of the semiconductor device including a photosensor include an imaging device used in an electronic appliance such as a scanner or a digital still camera.

According to this embodiment, it is possible to provide an inexpensive display device or semiconductor device capable of capturing, with a high resolution, an image based on a wide range of light intensities.

This embodiment can be implemented in appropriate combination with any of the other embodiments.

(Embodiment 4)

In this embodiment, a method for driving a plurality of photosensors will be described.

Figure 6:
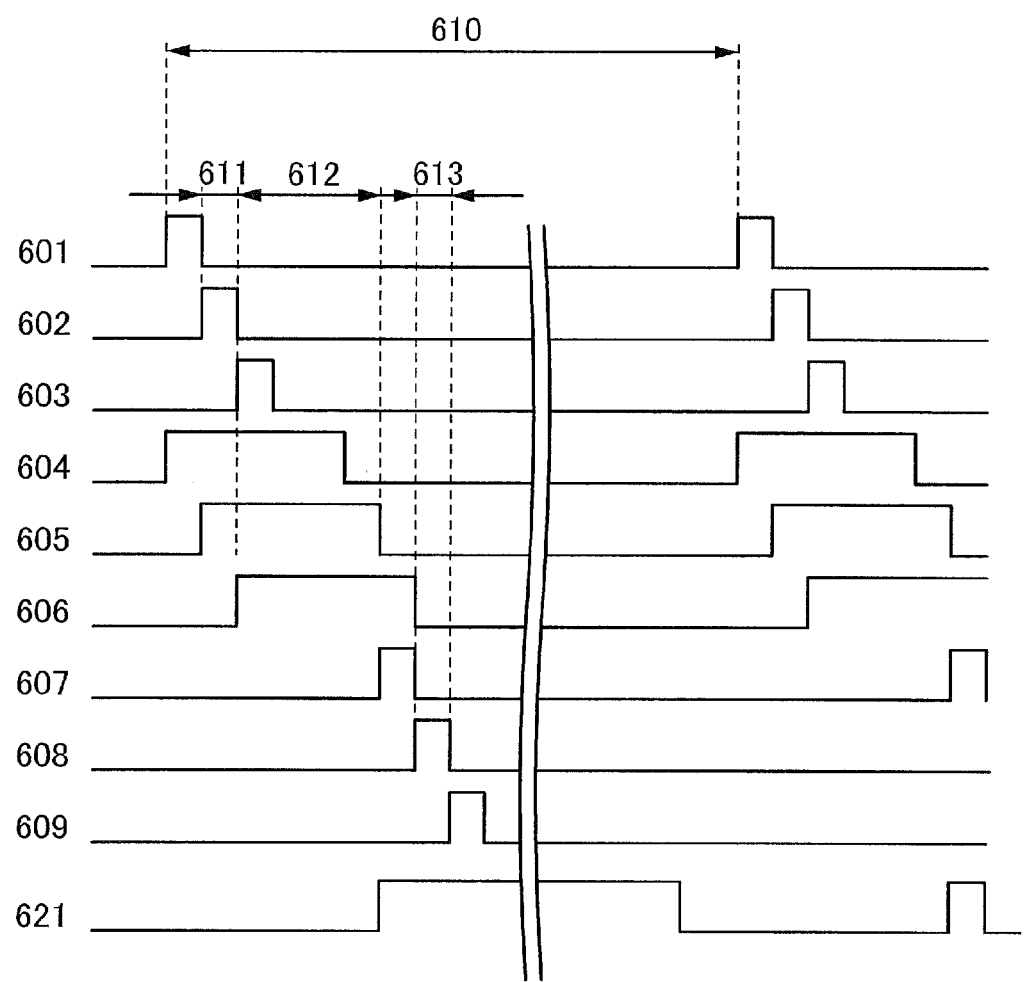
FIG. 6 is a timing diagram for describing one embodiment of the present invention.

First, a driving method shown in the timing diagram of FIG. 6 will be described assuming that it is used for the photosensor in FIG. 3A. FIG. 6 is a timing diagram showing the signal waveforms of a signal 601 input to the photodiode reset line 16 in a photosensor of the first row, a signal 602 input to the photodiode reset line 16 in a photosensor of the second row, and a signal 603 input to the photodiode reset line 16 in a photosensor of the third row, a signal 604 input to the gate line 42 in the photosensor of the first row, a signal 605 input to the gate line 42 in the photosensor of the second row, a signal 606 input to the gate line 42 in the photosensor of the third row, a signal 607 input to the gate line 17 in the photosensor of the first row, a signal 608 input to the gate line 17 in the photosensor of the second row, a signal 609 input to the gate line 17 in the photosensor of the third row, and a signal 621 input to the photosensor selection line 19. A period 610 is a period required for one-time image capture. A period 611 is a period during which the reset operation is performed in the photosensor of the second row; a period 612 is a period during which the storage operation is performed in the photosensor of the second row; a period 613 is a period during which the selection operation is performed in the photosensor of the second row. Thus sequentially driving the photosensors row by row enables images capturing.

It is found here that the storage operation in the photosensor of each row has a time lag. That is, image capture in the photosensor of each row is not performed simultaneously, leading to blurring of the image captured. In particular, an image of an object which moves fast is easily taken to have a distorted shape: if the object moves in a direction from the first row to the third row, an enlarged image is taken leaving a trail behind it; and if the object moves in the opposite direction, a reduced image is taken.

In order to prevent the time lag of the storage operation in the photosensor of each row, it is effective that the photosensor of each row is sequentially driven in a shorter cycle. In this case, however, the output signal of the photosensor needs to be obtained at very high speed with an OP amplifier or an AD converter circuit, which causes an increase in power consumption, and makes it very difficult to obtain an image with high resolution, in particular.

Figure 7:
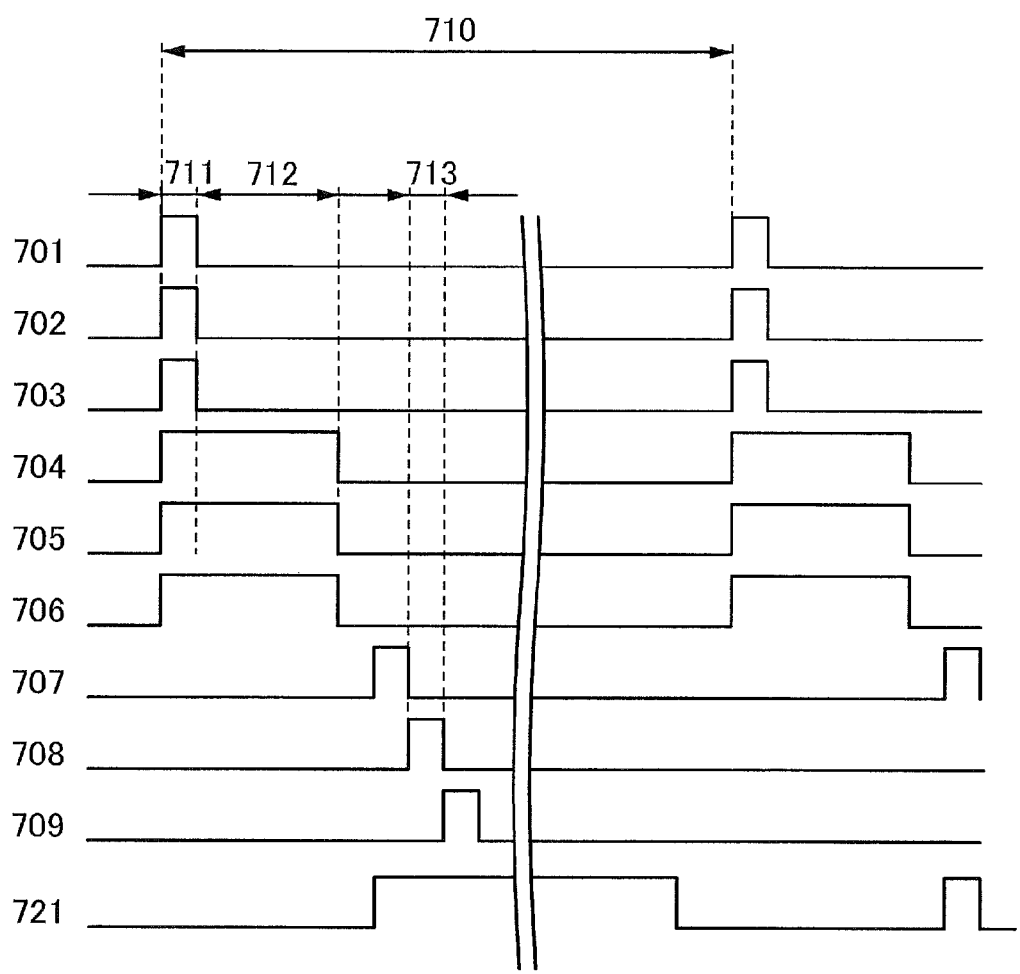
FIG. 7 is a timing diagram for describing one embodiment of the present invention.

Thus, a driving method shown in the timing diagram of FIG. 5 is proposed. FIG. 7 is a timing diagram showing the signal waveforms of a signal 701 input to the photodiode reset line 16 in the photosensor of the first row, a signal 702 input to the photodiode reset line 16 in the photosensor of the second row, a signal 703 input to the photodiode reset line 16 in the photosensor of the third row, a signal 704 input to the gate line 42 in the photosensor of the first row, a signal 705 input to the gate line 42 in the photosensor of the second row, a signal 706 input to the gate line 42 in the photosensor of the third row, a signal 707 input to the gate line 17 in the photosensor of the first row, a signal 708 input to the gate line 17 in the photosensor of the second row, a signal 709 input to the gate line 17 in the photosensor of the third row, and a signal 721 input to the photosensor selection line 19. A period 710 is a period required for one-time image capture. A period 711 is a period during which the reset operation (at the same time in all the rows) is performed in the photosensor of the second row, a period 712 is a period during which the storage operation (at the same time in all the rows) is performed in the photosensor of the second row, and a period 713 is a period during which the selection operation is performed in the photosensor of the second row.

FIG. 7 is different from FIG. 6 in that the reset operation and the storage operation are performed in the same period in the photosensors of all the rows, and after the storage operation, the selection operation is sequentially performed in each row without synchronization with the storage operation. When the storage operation is performed in the same period, image capture in the photosensor of each row is performed simultaneously and an image of an object can be easily taken with little blur even when the object moves fast. Since the storage operation is performed at the same time, a driver circuit can be provided in common for the photodiode reset line 16 of each photosensor. Further, a driver circuit can also be provided in common for the gate line 42 of each photosensor. Such driver circuits provided in common are effective in reducing the number of peripheral circuits or reducing power consumption. In addition, the selection operation sequentially performed in each row makes it possible to lower the operation rate of an OP amplifier or an A/D converter circuit when the output signal of the photosensor is obtained. At this time, the total time for the selection operation is preferably longer than the time for the storage operation, which is particularly effective in the case of obtaining an image with high resolution.

Note that FIG. 7 shows the timing diagram of the method for sequentially driving the photosensor of each row; it is also effective to sequentially drive the photosensor only in a certain row in order to obtain an image in a particular region. As a result, a desired image can be obtained while the operation and power consumption of the OP amplifier or the A/D converter circuit are reduced. Further, a method for driving the photosensor of every several rows is also effective. That is, one or some of the plurality of photosensors are driven. As a result, an image with desired resolution can be obtained while the operation and power consumption of the OP amplifier or the A/D converter circuit are reduced.

Note that in order to achieve the aforementioned driving method, the potential of the gate of the transistor 14 in each photosensor needs to be kept constant even after the storage operation is completed. Thus, the transistor 41 preferably uses an oxide semiconductor to have an extremely low off-current as described in FIG. 3A.

Thus, it is possible to provide a low-power display device or semiconductor device which allows a high-resolution image of even a fast-moving object to be taken with little blur.

This embodiment can be implemented in appropriate combination with the other embodiments.

(Embodiment 5)

Figure 8:
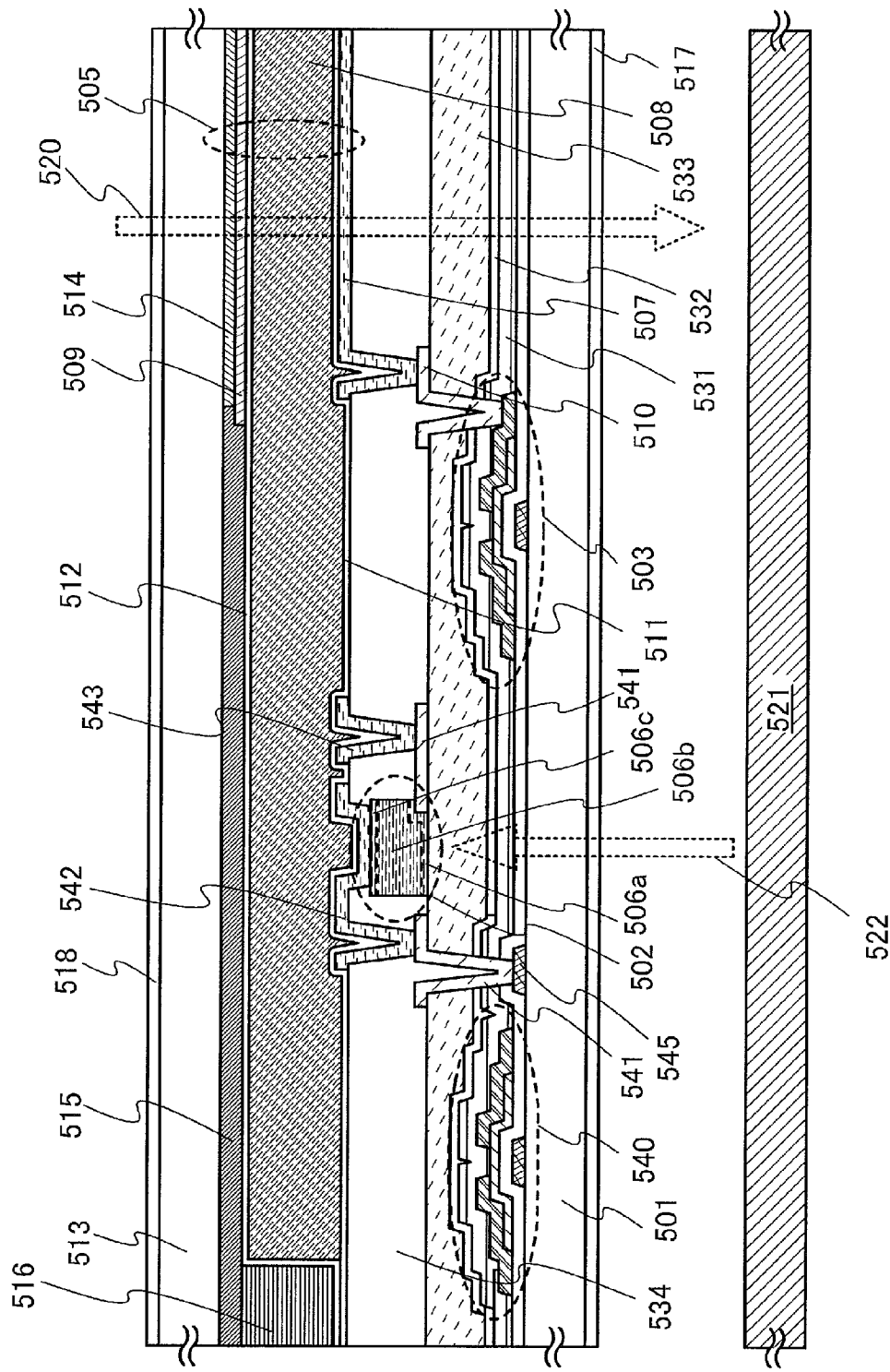
FIG. 8 is a cross-sectional view for describing one embodiment of the present invention.

In this embodiment, a structure and fabrication method of a semiconductor device including a photosensor will be described. FIG. 8 is a cross-sectional view of a semiconductor device. Note that the following semiconductor device can be applied to a display device.

FIG. 8 shows an example of a cross-sectional view of the semiconductor device including a photosensor. In the semiconductor device including a photosensor shown in FIG. 8, a photodiode 502, a transistor 540, a transistor 503, and a liquid crystal element 505 are formed over a substrate 501 having an insulating surface (a TFT substrate).

An oxide insulating layer 531, a protective insulating layer 532, an interlayer insulating layer 533, and an interlayer insulating layer 534 are provided over the transistor 503 and the transistor 540. The photodiode 502 is formed over the interlayer insulating layer 533. In the photodiode 502, a first semiconductor layer 506a, a second semiconductor layer 506b, and a third semiconductor layer 506c are stacked in that order over the interlayer insulating layer 533 between an electrode layer 541 formed over the interlayer insulating layer 533 and an electrode layer 542 formed over the interlayer insulating layer 534.

The electrode layer 541 is electrically connected to an electrode layer 543 which is formed in the interlayer insulating layer 534, and the electrode layer 542 is electrically connected to a gate electrode layer 545 through the electrode layer 541. The gate electrode layer 545 is electrically connected to a gate electrode layer of the transistor 540, and the photodiode 502 is electrically connected to the transistor 540.

In order to prevent variations in electric characteristics of the transistor 503 and the transistor 540 each formed using an oxide semiconductor layer, which are included in the semiconductor device including a photosensor, impurities such as hydrogen, moisture, hydroxyl group, or a hydride (also referred to as a hydrogen compound) which cause the variations are intentionally removed from the oxide semiconductor layer. Additionally, the oxide semiconductor layer is highly purified to become i-type (intrinsic) by supplying oxygen which is a major component of the oxide semiconductor, which is simultaneously reduced in a step of removing impurities.

Therefore, it is preferable that the oxide semiconductor contains hydrogen and carriers as little as possible. In the transistor 503 and the transistor 540, a channel formation region is formed in the oxide semiconductor layer, in which hydrogen contained therein is removed as much as possible to be close to 0 so that the hydrogen concentration is less than or equal to $5\times10^{19}/cm^3$, preferably, less than or equal to $5\times10^{18}/cm^3$, more preferably, less than or equal to $5\times10^{17}/cm^3$ or less than $5\times10^{16}/cm^3$, and the carrier concentration is less than $5\times10^{14}/cm^3$, preferably, less than or equal to $5\times10^{12}/cm^3$.

Since a very few (closed to 0) carries exist in the oxide semiconductor, it is preferable that the off-state current of the transistor 503 and the transistor 540 be as low as possible. The off-state current is a current that flows between a source and a drain of a transistor in the case where a gate voltage between −1 V to −10 V is applied. A current value per 1 μm in a channel width (w) of a transistor formed using an oxide semiconductor, which is disclosed in this specification, is less than or equal to 100 aA/μm, preferably, less than or equal to 10 aA/μm, more preferably, less than or equal to 1 aA/μm. Further, since there is no pn junction and no hot carrier degradation, electric characteristics of the transistor are not adversely affected by them.

Therefore, the above transistors 503 and 540 formed using the oxide semiconductor layer have an extremely low off-state current and have stable electric characteristics and high reliability.

As the oxide semiconductor film included in each of the transistor 503 and the transistor 540, any of a four-component metal oxide such as an In—Sn—Ga—Zn—O film, a three-component metal oxide such as an In—Ga—Zn—O film, an In—Sn—Zn—O film, an In—Al—Zn—O film, a Sn—Ga—Zn—O film, an Al—Ga—Zn—O film, and a Sn—Al—Zn—O film, or a two-component metal oxide such as an In—Zn—O film, a Sn—Zn—O film, an Al—Zn—O film, a Zn—Mg—O film, a Sn—Mg—O film, an In—Mg—O film, an In—O film, a Sn—O film, and a Zn—O film can be used. Further, $SiO_2$ may be contained in the above oxide semiconductor film.

Note that as the oxide semiconductor film, a thin film expressed by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor film whose composition formula is represented by $InMO_3(ZnO)_m$ (m>0), which includes Ga as M, is referred to as the In—Ga—Zn—O oxide semiconductor described above, and a thin film of the In—Ga—Zn—O oxide semiconductor is also referred to as an In—Ga—Zn—O-based non-single-crystal film.

Here, a pin photodiode in which a semiconductor layer having p-type conductivity as the first semiconductor layer 506a, a high-resistance semiconductor layer (i-type semiconductor layer) as the second semiconductor layer 506b, and a semiconductor layer having n-type conductivity as the third semiconductor layer 506c are stacked is shown as an example.

The first semiconductor layer 506a is a p-type semiconductor layer and can be formed using an amorphous silicon film containing an impurity element imparting p-type conductivity. The first semiconductor layer 506a is formed with a plasma CVD method with the use of a semiconductor source gas containing an impurity element belonging to Group 13 (such as boron (B)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion injecting method. Heating or the like may be performed after introducing the impurity element with an ion injecting method or the like in order to diffuse the impurity element. In this case, as a method of forming the amorphous silicon film, an LPCVD method, a chemical vapor deposition method, a sputtering method, or the like may be used. The thickness of the first semiconductor layer 506a is preferably 10 nm to 50 nm.

The second semiconductor layer 506b is an i-type semiconductor layer (intrinsic semiconductor layer) and is formed with an amorphous silicon film. For the formation of the second semiconductor layer 506b, an amorphous silicon film is formed with a plasma CVD method using a semiconductor material gas. As the semiconductor material gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 506b may be alternatively formed with an LPCVD method, a chemical vapor deposition method, a sputtering method, or the like. The thickness of the second semiconductor layer 506b is preferably 200 nm to 1000 nm.

The third semiconductor layer 506c is an n-type semiconductor layer and is formed with an amorphous silicon film containing an impurity element imparting n-type conductivity. The third semiconductor layer 506c is formed with a plasma CVD method using a semiconductor material gas containing an impurity element belonging to Group 15 (such as phosphorus (P)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion injecting method. Heating or the like may be performed after the impurity element is introduced with an ion injecting method or the like in order to diffuse the impurity element. In this case, as a method of forming the amorphous silicon film, an LPCVD method, a chemical vapor deposition method, a sputtering method, or the like may be used. The thickness of the third semiconductor layer 506c is preferably 20 nm to 200 nm.

The first semiconductor layer 506a, the second semiconductor layer 506b, and the third semiconductor layer 506c are not necessarily formed using an amorphous semiconductor, and they may be formed using a polycrystalline semiconductor or a microcrystalline semiconductor (a semiamorphous semiconductor (SAS)).

Given the Gibbs free energy, the microcrystalline semiconductor belongs to a metastable state of an intermediate between amorphous and single crystalline. That is, the microcrystalline semiconductor film is a semiconductor having a third state which is stable in the free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is shifted to a small wavenumber region below 520 $cm^{-1}$ which represents single-crystalline silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon contains hydrogen or halogen of 1 atomic % or more in order to terminate a dangling bond. Moreover, microcrystalline silicon contains a rare gas element such as helium, argon, krypton, or neon to further promote lattice distortion, providing a favorable microcrystalline semiconductor film with a higher stability.

The microcrystalline semiconductor film can be formed with a high-frequency plasma CVD apparatus with a frequency of several tens of MHz to several hundreds of MHz or with a microwave plasma CVD method with a frequency of greater than or equal to 1 GHz. Typically, the microcrystalline semiconductor film can be formed using a silicon hydride such as $SiH_4$, $Si_2H_6$, $SiH_2Cl_2$ or $SiHCl_3$, $SiCl_4$, or $SiF_4$, which is diluted with hydrogen. With a dilution with one or more kinds of rare gas elements selected from helium, argon, krypton, or neon in addition to silicon hydride and hydrogen, the microcrystalline semiconductor film can be formed. In that case, the flow ratio of hydrogen to the silicon hydride is 5:1 to 200:1, preferably, 50:1 to 150:1, more preferably, 100:1. Further, a carbide gas such as $CH_4$ or $C_2H_6$, a germanium gas such as $GeH_4$ or $GeF_4$, $F_2$, or the like may be mixed into the gas containing silicon.

In addition, since the mobility of holes generated by the photoelectric effect is lower than that of electrons, a pin photodiode has better characteristics when a surface on the p-type semiconductor layer side is used as a light-receiving plane. Here, an example where the photodiode 502 receives light from a surface of the substrate 501, over which a pin photodiode is formed, and the light is converted into electric signals will be described. Further, light from the semiconductor layer having a conductivity type opposite to that of the semiconductor layer on the light-receiving plane is disturbance light; therefore, the electrode layer is preferably formed using a light-blocking conductive film. A surface on the n-type semiconductor layer side can alternatively be used as the light-receiving plane.

The liquid crystal element 505 includes a pixel electrode 507, liquid crystal 508, and a counter electrode 509. The pixel electrode 507 is formed over the substrate 501 and electrically connected to the transistor 503 through a conductive film 510. The counter electrode 509 is formed over a substrate 513 (a counter substrate). The liquid crystal 508 is interposed between the pixel electrode 507 and the counter electrode 509. The transistor 503 corresponds to the transistor 201 in Embodiment 1.

A cell gap between the pixel electrode 507 and the counter electrode 509 can be controlled by using a spacer 516. In FIG. 8, the cell gap is controlled by using the columnar spacer 516 selectively formed by photolithography. Alternatively, the cell gap can be controlled by dispersing spherical spacers between the pixel electrode 507 and the counter electrode 509.

The liquid crystal 508 is surrounded by a sealing material between the substrate 501 and the substrate 513. The liquid crystal 508 may be injected with a dispenser method (droplet method) or a dipping method (pumping method).

For the pixel electrode 507, a light-transmitting conductive material such as indium tin oxide (ITO), indium tin oxide containing silicon oxide (ITSO), organic indium, organic tin, zinc oxide (ZnO), indium zinc oxide (IZO) containing zinc oxide (ZnO), zinc oxide containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like can be used. A conductive composition containing a conductive macromolecule (also referred to as a conductive polymer) can be used to form the pixel electrode 507. As the conductive macromolecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, or the like can be given.

Since the transparent liquid crystal element 505 is given as an example in this embodiment, the light-transmitting conductive material described above can be used also for the counter electrode 509 as in the case of the pixel electrode 507.

An alignment film 511 is provided between the pixel electrode 507 and the liquid crystal 508, and an alignment film 512 is provided between the counter electrode 509 and the liquid crystal 508. The alignment film 511 and the alignment film 512 can be formed using an organic resin such as a polyimide or polyvinyl alcohol. Alignment treatment such as rubbing is performed on their surfaces in order to align liquid crystal molecules in certain direction. Rubbing can be performed by rolling a roller wrapped with cloth of nylon or the like while applying pressure on the alignment film so that the surface of the alignment film is rubbed in certain direction. Note that by using an inorganic material such as silicon oxide, the alignment film 511 and the alignment film 512 each having an alignment property can be directly formed with an evaporation method without performing an alignment treatment.

Further, a color filter 514 through which light in a particular wavelength range can pass is formed over the substrate 513 so as to overlap with the liquid crystal element 505. The color filter 514 can be selectively formed by photolithography after application of an organic resin such as an acrylic-based resin in which colorant is dispersed on the substrate 513. Alternatively, the color filter 514 can be selectively formed by etching after application of a polyimide-based resin in which colorant is dispersed on the substrate 513. Alternatively, the color filter 514 can be selectively formed with a droplet discharge method such as an ink-jet method.

Furthermore, a shielding film 515 which can block light is formed over the substrate 513 so as to overlap with the photodiode 502. By providing the shielding film 515, light from a backlight that passes through the substrate 513 and enters the touch panel can be prevented from being directly delivered to the photodiode 502. Further, disclination due to disorder of alignment of the liquid crystal 508 among pixels can be prevented from being viewed. An organic resin containing black colorant such as carbon black or titanium lower oxide whose oxidation number is smaller than that of titanium dioxide can be used for the shielding film 515. Alternatively, a film formed using chromium can be used for the shielding film 515.

Furthermore, a polarizing plate 517 is provided on a surface which is on the opposite side of a surface of the substrate 501 over which the pixel electrode 507 is formed, and a polarizing plate 518 is provided on a surface which is on the opposite side of a surface of the substrate 513 on which the counter electrode 509 is formed.

With the use of an insulating material, the oxide insulating layer 531, the protective insulating layer 532, the interlayer insulating layer 533, and the interlayer insulating layer 534 can be formed, depending on the material, by a method such as a sputtering method, an SOG method, a spin coating, a dip coating, a spray coating, a droplet discharge method (e.g., an ink-jet method, screen printing, offset printing, or the like), or with a tool such as a doctor knife, a roll coater, a curtain coater, a knife coater, or the like.

As the oxide insulating layer 531, a single layer or a stack of an oxide insulating layer such as a silicon oxide layer, a silicon oxynitride layer, an aluminum oxide layer, an aluminum oxynitride layer, or the like can be used.

As an inorganic insulating material of the protective insulating layer 532, a single layer or a stacked layer of a nitride insulating layer such as a silicon nitride layer, a silicon nitride oxide layer, an aluminum nitride layer, an aluminum nitride oxide layer, or the like can be used. High-density plasma CVD with the use of microwaves (2.45 GHz) is preferably employed because formation of a dense and high-quality insulating layer having high withstand voltage is possible.

To reduce surface roughness, an insulating layer functioning as a planarization insulating film is preferably used as the interlayer insulating layers 533 and 534. The interlayer insulating layers 533 and 534 can be formed using an organic insulating material having heat resistance such as a polyimide, an acrylic resin, a benzocyclobutene-based resin, a polyamide, or an epoxy resin. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

Light from the backlight passes through the substrate 513 and the liquid crystal element 505 and is delivered to an object 521 on the substrate 501 side as shown by an arrow 520. Then, light reflected by the object 521 enters the photodiode 502 as shown by an arrow 522.

The liquid crystal element may be a TN (twisted nematic) mode liquid crystal element, a VA (vertical alignment) mode liquid crystal element, an OCB (optically compensated birefringence) mode liquid crystal element, an IPS (in-plane switching) mode liquid crystal element, or the like. Alternatively, liquid crystal exhibiting a blue phase for which an alignment film is unnecessary may be used.

Note that although the liquid crystal element 505 in which the liquid crystal 508 is interposed between the pixel electrode 507 and the counter electrode 509 is described as an example in this embodiment, the semiconductor device according to one embodiment of the present invention is not limited to this structure. A liquid crystal element in which a pair of electrodes is formed on the substrate 501 side like an IPS mode liquid crystal element may also be employed.

The above-described structure enables the semiconductor device capable of image capture with high-speed operation.

This embodiment can be implemented in appropriate combination with the other embodiments.

(Embodiment 6)

The semiconductor device according to one embodiment of the present invention can be used as a touch panel. Touch panels can be used in display devices, laptop computers, and image reproducing devices provided with recording media (a typical example of which is devices reproducing the content of recording media such as DVDs (digital versatile disc) and having a display for displaying the reproduced images). Examples of an electronic appliance in which a touch panel according to one embodiment of the present invention can be used include mobile phones, portable game consoles, personal digital assistants, e-book readers, video cameras, digital still cameras, goggle-type displays (head mounted displays), navigation systems, audio reproducing devices (e.g., car audio components and digital audio players), copiers, facsimiles, printers, multifunction printers, automated teller machines (ATM), and vending machines.

In this embodiment, examples of the electronic appliance including a touch panel according to one embodiment of the present invention will be described with reference to FIGS. 9A to 9D.

Figure 9A:
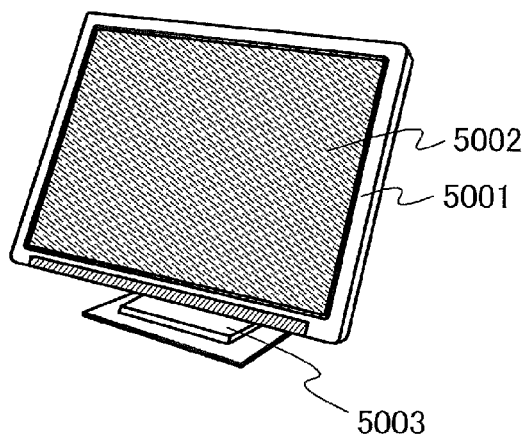
FIGS. 9A to 9D are diagrams each showing an example of an electronic appliance.

FIG. 9A shows a display device including a housing 5001, a display area 5002, a supporting base 5003, and the like. A touch panel according to one embodiment of the present invention can be used for the display area 5002. The use of the touch panel according to one embodiment of the present invention for the display area 5002 can provide a display device capable of obtaining an image data with high resolution and being equipped with higher-performance applications. Note that a display device includes all display devices for displaying information, such as display devices for personal computers, for receiving television broadcast, and for displaying advertisement, in its category.

Figure 9B:
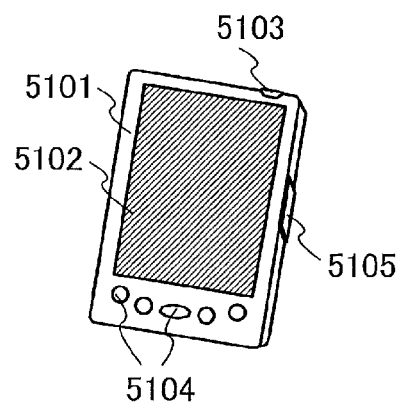

FIG. 9B shows a personal digital assistant including a housing 5101, a display area 5102, a switch 5103, a control key 5104, an infrared port 5105, and the like. A touch panel according to one embodiment of the present invention can be used for the display area 5102. The use of the touch panel according to one embodiment of the present invention for the display area 5102 can provide a personal digital assistant capable of obtaining an image data with high resolution and being equipped with higher-performance applications.

Figure 9C:
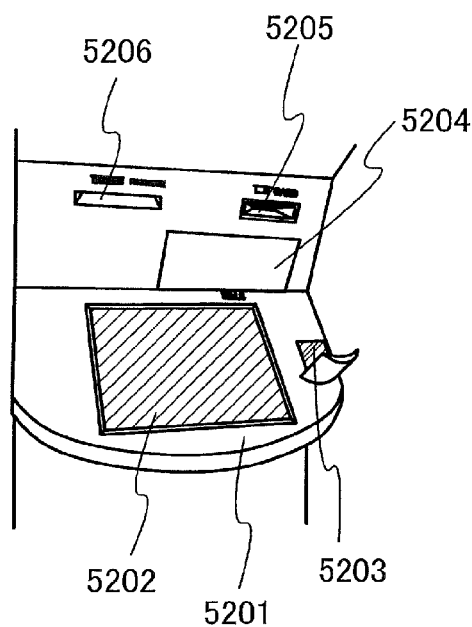

FIG. 9C shows an automated teller machine including a housing 5201, a display area 5202, a coin slot 5203, a bill slot 5204, a card slot 5205, a bankbook slot 5206, and the like. A touch panel according to one embodiment of the present invention can be used for the display area 5202. The use of the touch panel according to one embodiment of the present invention for the display area 5202 can provide an automated teller machine capable of obtaining an image data with high resolution and being equipped with higher-performance applications. The automated teller machine using the touch panel according to one embodiment of the present invention can read information of living body such as a fingerprint, a face, a handprint, a palm print, a pattern of hand veins, an iris, and the like which are used for biometrics with higher accuracy. Therefore, a false non-match rate which is false recognition of a person to be identified as a different person and a false acceptance rate which is false recognition of a different person as a person to be identified can be suppressed.

Figure 9D:
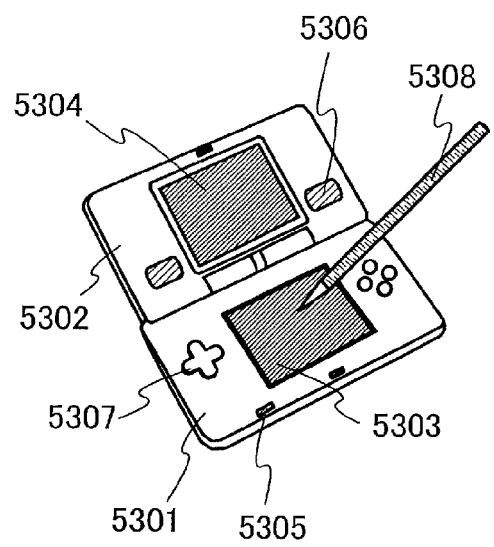

FIG. 9D shows a portable game console including a housing 5301, a housing 5302, a display area 5303, a display area 5304, a microphone 5305, a speaker 5306, a control key 5307, a stylus 5308, and the like. A touch panel according to one embodiment of the present invention can be used for the display area 5303 or the display area 5304. The use of the touch panel according to one embodiment of the present invention for the display area 5303 or the display area 5304 can provide a portable game console capable of obtaining an image data with high resolution and being equipped with higher-performance applications. Note that although the portable game console shown in FIG. 9D includes two display areas 5303 and 5304, the number of display areas included in the portable game console is not limited thereto.

This embodiment can be implemented in appropriate combination with the other embodiments.

This application is based on Japanese Patent Application serial no. 2010-056526 filed with Japan Patent Office on Mar. 12, 2010, the entire contents of which are hereby incorporated by reference.

The invention claimed is:

1. A semiconductor device comprising:
a photodiode;
a first transistor, a gate thereof electrically connected to the photodiode;
a second transistor; and
a read control circuit including a third transistor,
wherein:
one of a source and a drain of the second transistor is electrically connected to one of a source and a drain of the first transistor,
the other of the source and the drain of the second transistor and one of a source and a drain of the third transistor are electrically connected to a photosensor output line,
each of the first transistor, the second transistor and the third transistor comprises an oxide semiconductor layer in a channel formation region thereof, and
the photodiode is positioned over the first transistor and the second transistor with an insulating layer therebetween.

2. The semiconductor device according to claim 1, wherein the oxide semiconductor layer comprises at least one of indium, gallium, tin, and zinc.

3. The semiconductor device according to claim 1, wherein the photodiode is selected from a PN diode, a PIN diode, a Schottky diode, and an avalanche diode.

4. The semiconductor device according to claim 1, wherein a plurality of photosensors each comprising the photodiode, the first transistor and the second transistor is arranged in row and column directions over a substrate.

5. The semiconductor device according to claim 4, wherein the plurality of photosensors is configured to concurrently perform a reset operation and a storage operation in all the rows, and sequentially perform a read operation in each row.

6. The semiconductor device according to claim 1, wherein an off-state current of each of the first transistor, the second transistor and the third transistor is less than or equal to 100 aA per 1 µm in a channel width.

7. The semiconductor device according to claim 1, wherein the photosensor output line is electrically connected to a photosensor reading circuit.

8. The semiconductor device according to claim 1, wherein:
the first transistor is electrically connected to a first wiring supplied with a first reference potential, and
the third transistor is electrically connected to a second wiring supplied with a second reference potential lower than the first reference potential.

9. The semiconductor device according to claim 1, wherein the other of the source and the drain of the third transistor is connected to a first wiring which is configured to be supplied with a first reference potential,
wherein the other of the source and the drain of the first transistor is connected to a second wiring which is configured to be supplied with a second reference potential, and
wherein the first reference potential is different from the second reference potential.

10. A semiconductor device comprising:
a photodiode;
a first transistor, a gate thereof electrically connected to the photodiode;
a second transistor, one of a source and a drain thereof electrically connected to a source or a drain of the first transistor; and
a read control circuit,
wherein:
the other of the source and the drain of the second transistor and the read control circuit are electrically connected to a photosensor output line,
the read control circuit is electrically connected between the other of the source and the drain of the second transistor and a first wiring configured to be supplied with a first reference potential, each of the first transistor and the second transistor comprises an oxide semiconductor layer in a channel formation region thereof, and the photodiode is positioned over the first transistor and the second transistor with an insulating layer therebetween.

11. The semiconductor device according to claim 10, wherein the oxide semiconductor layer comprises at least one of indium, gallium, tin, and zinc.

12. The semiconductor device according to claim 10, wherein the photodiode is selected from a PN diode, a PIN diode, a Schottky diode, and an avalanche diode.

13. The semiconductor device according to claim 10, wherein a plurality of photosensors each comprising the photodiode, the first transistor and the second transistor is arranged in row and column directions over a substrate.

14. The semiconductor device according to claim 13, wherein the plurality of photosensors is configured to concurrently perform a reset operation and a storage operation in all the rows, and sequentially perform a read operation in each row.

15. The semiconductor device according to claim 10, wherein an off-state current of each of the first transistor and the second transistor is less than or equal to 100 aA per 1 μm in a channel width.

16. The semiconductor device according to claim 10, wherein the photosensor output line is electrically connected to a photosensor reading circuit.

17. The semiconductor device according to claim 10,
wherein the other of the source and the drain of the first transistor is connected to a second wiring which is configured to be supplied with a second reference potential, and wherein the first reference potential is different from the second reference potential.

* * * * *